(12) United States Patent
Enoki et al.

(10) Patent No.: US 7,652,125 B2
(45) Date of Patent: *Jan. 26, 2010

(54) RESIN COMPOSITION, POLYIMIDE RESIN COMPOSITION, POLYBENZOXAZOLE RESIN COMPOSITION, VARNISH, RESIN FILM AND SEMICONDUCTOR DEVICE USING THE SAME

(75) Inventors: Takashi Enoki, Tokyo (JP); Atsushi Izumi, Tokyo (JP); Yumiko Yamamoto, Tokyo (JP); Takahiro Harada, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 258 days.

This patent is subject to a terminal disclaimer.

(21) Appl. No.: 11/663,854

(22) PCT Filed: Sep. 29, 2005

(86) PCT No.: PCT/JP2005/018023

§ 371 (c)(1), (2), (4) Date: Mar. 27, 2007

(87) PCT Pub. No.: WO2006/035904

PCT Pub. Date: Apr. 6, 2006

(65) Prior Publication Data

US 2008/0255335 A1 Oct. 16, 2008

(30) Foreign Application Priority Data

Sep. 30, 2004 (JP) ............................. 2004-288990
Feb. 16, 2005 (JP) ............................. 2005-039222

(51) Int. Cl.
*C08G 65/40* (2006.01)
*C08G 65/38* (2006.01)

(52) U.S. Cl. ............... 528/211; 514/233.8; 514/255.05; 514/337; 514/338; 514/375; 528/185; 528/187; 528/210; 548/152; 548/217; 548/221; 548/224

(58) Field of Classification Search ............. 514/233.8, 514/255.05, 337, 338, 375; 528/185, 187, 528/210, 211; 548/152, 217, 221, 224
See application file for complete search history.

(56) References Cited

U.S. PATENT DOCUMENTS 6,054,554 A * 4/2000 Choi et al. .................. 528/353

2003/0153719 A1 8/2003 Kato
2009/0118431 A1 * 5/2009 Fujita et al. ............... 525/326.8

FOREIGN PATENT DOCUMENTS

| JP | 11-343344 | * | 12/1999 |
| JP | 2000-195853 | | 7/2000 |
| JP | 2002-327058 | * | 11/2002 |
| JP | 2003-012802 | | 1/2003 |
| JP | 2003-12802 | * | 1/2003 |
| JP | 2003-252992 | * | 9/2003 |

* cited by examiner

*Primary Examiner*—Terressa M Boykin
(74) *Attorney, Agent, or Firm*—Smith, Gambrell & Russell, LLP

(57) ABSTRACT

A resin composition having high heat resistance and low dielectric constant after heat treatment, a varnish thereof and a semiconductor device using the same are provided by a resin composition including a compound having a structure represented by the general formula (1):

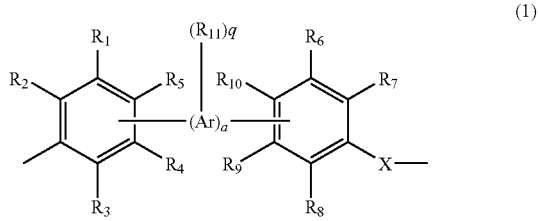

(1)

wherein, "Ar" is an aromatic group; "a" is 0 or 1; $R_{11}$ is an organic group having one or more carbon atoms and at least one is a group having an alicyclic structure; when "q" is an integer of 2 or more, $R_{11}$s may be the same or different from each other; at least one of $R_1$ to $R_5$ and at least one of $R_6$ to $R_{10}$ on respective benzene rings are Ar-binding sites or $R_{11}$-binding sites and the others of $R_1$ to $R_5$ and $R_6$ to $R_{10}$ are each hydrogen, a group having an alicyclic structure, an organic group having 1 to 10 carbon atoms, a hydroxyl group or a carboxyl group; when "a" is 0, at least one of $R_1$ to $R_5$ and $R_6$ to $R_{10}$ is a group having an alicyclic structure; "q" is an integer of 1 or more; and "X" is any of —O—, —NHCO—, —COHN—, —COO— and —OCO—.

14 Claims, 1 Drawing Sheet

RESIN COMPOSITION, POLYIMIDE RESIN COMPOSITION, POLYBENZOXAZOLE RESIN COMPOSITION, VARNISH, RESIN FILM AND SEMICONDUCTOR DEVICE USING THE SAME

CROSS REFERENCE TO RELATED APPLICATION DATA

This application is a 371 of PCT/JP05/18023, filed Sep. 29, 2005, and claims the benefit of priority to JP 2004-288990, filed Sep. 30, 2004, and JP 2005-039222, filed Feb. 16, 2005.

TECHNICAL FIELD

The present invention relates to a resin composition, a polyimide resin composition, a polybenzoxazole resin composition, a varnish, a resin film and a semiconductor device using the same.

BACKGROUND ART

As an interlayer insulation film for a semiconductor device, there is mainly used an oxide film (SiOx film) prepared by CVD method (Chemical Vapor Deposition method) and so on. An inorganic insulation film, however, can hardly achieve speeding up and upgrade of a semiconductor due to high dielectric constant thereof. Accordingly, organic materials are considered to be used as interlayer insulation films having low dielectric constant. Such organic materials are required to be excellent in heat resistance and electrical properties, and to have low dielectric constant.

As such organic materials, polyimide resins, polyquinoline resins, polyquinoxaline resins and so on have been studied. (For example, see Japanese Patent Application Laid-Open (JP-A) No. 2000-195853.)

However, polyimide resins generally have problems of low heat resistance, high dielectric constant, high moisture absorptivity and so on. Thereby, use of polyimide resins is limited to some semiconductor elements such as a bipolar semiconductor element due to reliability thereof.

On the other hand, polyquinoline resins and polyquinoxaline resins having higher heat resistance, lower dielectric constant and lower moisture absorptivity than polyimide resins are thermoplastic resins and there is a problem accordingly that patterns of the resins may change shape by being exposed to temperatures higher than glass-transition points thereof during semiconductor production.

DISCLOSURE OF INVENTION

Problems to be Solved by the Invention

An object of the present invention is therefore to provide a resin composition having high heat resistance and low dielectric constant, a varnish thereof, a resin film thereof and a semiconductor device using the same.

Another object of the present invention is to provide a polyimide resin composition and a polybenzoxazole resin composition having heat resistance and low dielectric constant, varnishes thereof, resin films thereof and a semiconductor device using the same.

Means for Solving the Problems

Said purposes are achieved by the present invention described in the following [1] to [16].

[1] A resin composition comprising a compound having a structure represented by a general formula (1):

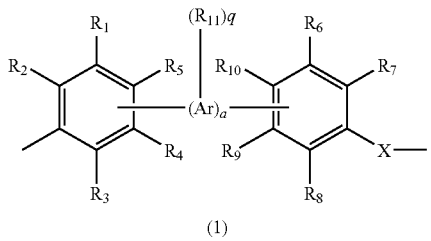

[Chemical formula 1]

(1)

wherein, "Ar" is an aromatic group; "a" is 0 or 1; $R_{11}$ is hydrogen or an organic group having one or more carbon atoms; when "q" is an integer of 2 or more, $R_{11}$s may be the same or different from each other; at least one of $R_1$ to $R_5$ and at least one of $R_6$ to $R_{10}$ on respective benzene rings are Ar-binding sites or $R_{11}$-binding sites and the others of $R_1$ to $R_5$ and $R_6$ to $R_{10}$ are each hydrogen, a group having an alicyclic structure, an organic group having 1 to 10 carbon atoms other than the group having an alicyclic structure, a hydroxyl group or a carboxyl group; at least one of $R_{11}$, $R_1$ to $R_5$ and $R_6$ to $R_{10}$ is a group having an alicyclic structure; "q" is an integer of 1 or more; and "X" is any of —O—, —NHCO—, —COHN—, —COO— and —OCO—.

[2] A resin composition as described in [1], wherein "a" is 1 in the compound having a structure represented by the general formula (1).

[3] A resin composition as described in [1] or [2], wherein the compound having a structure represented by the general formula (1) comprises at least one group having an alicyclic structure as $R_{11}$.

[4] A resin composition as described in [3], wherein at least one of $R_1$ to $R_5$ and at least one of $R_6$ to $R_{10}$ on respective benzene rings are Ar-binding sites or $R_{11}$-binding sites and the others of $R_1$ to $R_5$ and $R_6$ to $R_{10}$ are each hydrogen, an organic group having 1 to 10 carbon atoms other than the group having an alicyclic structure, a hydroxyl group or a carboxyl group in the compound having a structure represented by the general formula (1).

[5] A resin composition as described in [1], wherein "a" is 0; at least one of $R_1$ to $R_5$ and at least one of $R_6$ to $R_{10}$ on respective benzene rings are $R_{11}$-binding sites and the others of $R_1$ to $R_5$ and $R_6$ to $R_{10}$ are each hydrogen, a group having an alicyclic structure, an organic group having 1 to 10 carbon atoms other than the group having an alicyclic structure, a hydroxyl group or a carboxyl group; and at least one of $R_{11}$, $R_1$ to $R_5$, $R_6$ to $R_{10}$ is the group having an alicyclic structure in the compound having a structure represented by a general formula (1).

A resin composition as described in any of [1] to [5], wherein the compound having a structure represented by the general formula (1) comprises a group selected from structures represented by general formula (2) as "Ar" of the general formula (1):

[Chemical formula 2]

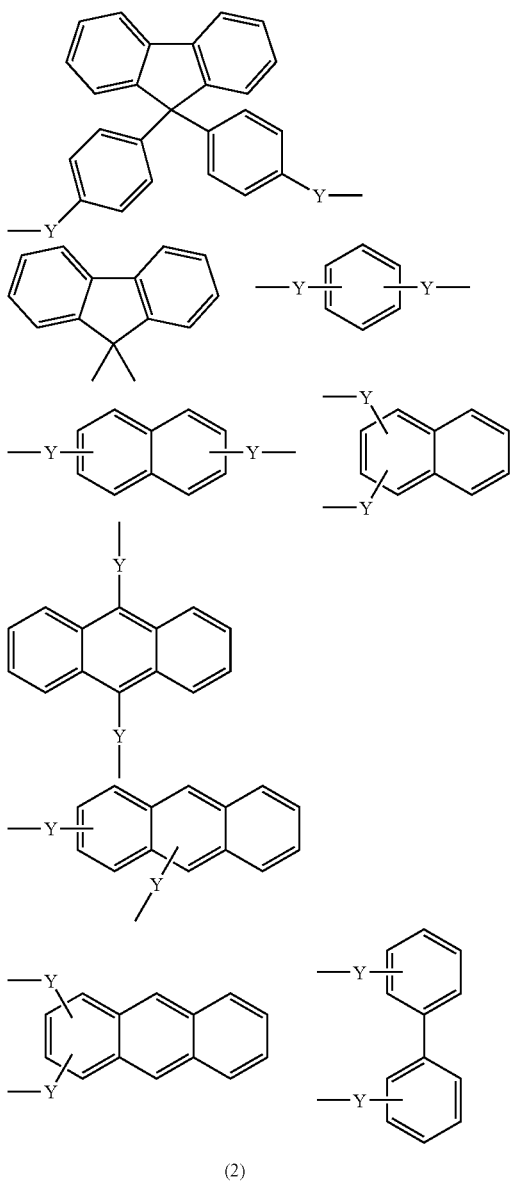

(2)

wherein, Y is any of —O—, —S—, —OCO— and —COO—.

[7] A resin composition as described in any of [1] to [6], wherein the group having an alicyclic structure is a group having an adamantane structure.

[8] A resin composition as described in [7], wherein the group having an alicyclic structure is a group having an adamantane structure substituted with an alkyl group having 1 to 20 carbon atoms.

[9] A resin composition as described in any of [1] to [8], wherein the compound having a structure represented by the general formula (1) comprises —NHCO— as "X" of the general formula (1) and carboxyl groups as $R_2$ or $R_3$, and $R_7$ or $R_8$.

[10] A resin composition as described in any of [1] to [8], wherein the compound having a structure represented by the general formula (1) comprises —NHCO— as "X" of the general formula (1) and hydroxyl groups as $R_2$ or $R_3$, and $R_7$ or $R_8$.

[11] A resin composition obtained by dehydrating and ring-closing the compound having a structure represented by the general formula (1) of the resin composition as described in any of [1] to [10].

[12] A polyimide resin composition obtained by dehydrating and ring-closing the compound having a structure represented by the general formula (1) of the resin composition as described in [9].

[13] A polybenzoxazole resin composition obtained by dehydrating and ring-closing the compound having a structure represented by the general formula (1) of the resin composition as described in [10].

[14] A varnish obtained from the resin composition as described in [11], the polyimide resin composition as described in [12] or the polybenzoxazole resin composition as described in [13].

[15] A resin film obtained by heat-treating the resin composition as described in [11], the polyimide resin composition as described in [12], the polybenzoxazole resin composition as described in [13] or the varnish as described in [14].

[16] A semiconductor device comprising the resin film as described in [15].

EFFECT OF THE INVENTION

The present invention provides a resin composition and a varnish thereof to form a resin film having high heat resistance and low dielectric constant, a resin film formed from the resin composition or varnish thereof, and a semiconductor device comprising the resin film.

The present invention also provides a polyimide resin precursor composition to form a polyimide resin which is excellent in heat resistance and a benzoxazole resin precursor composition to form a polybenzoxazole resin which is excellent in heat resistance.

The present invention also provides a polyimide resin composition and a polybenzoxazole resin composition each having high heat resistance and low dielectric constant, varnishes thereof, resin films formed from resin compositions and varnishes thereof and semiconductor devices made by using the resin films.

Figure 1:
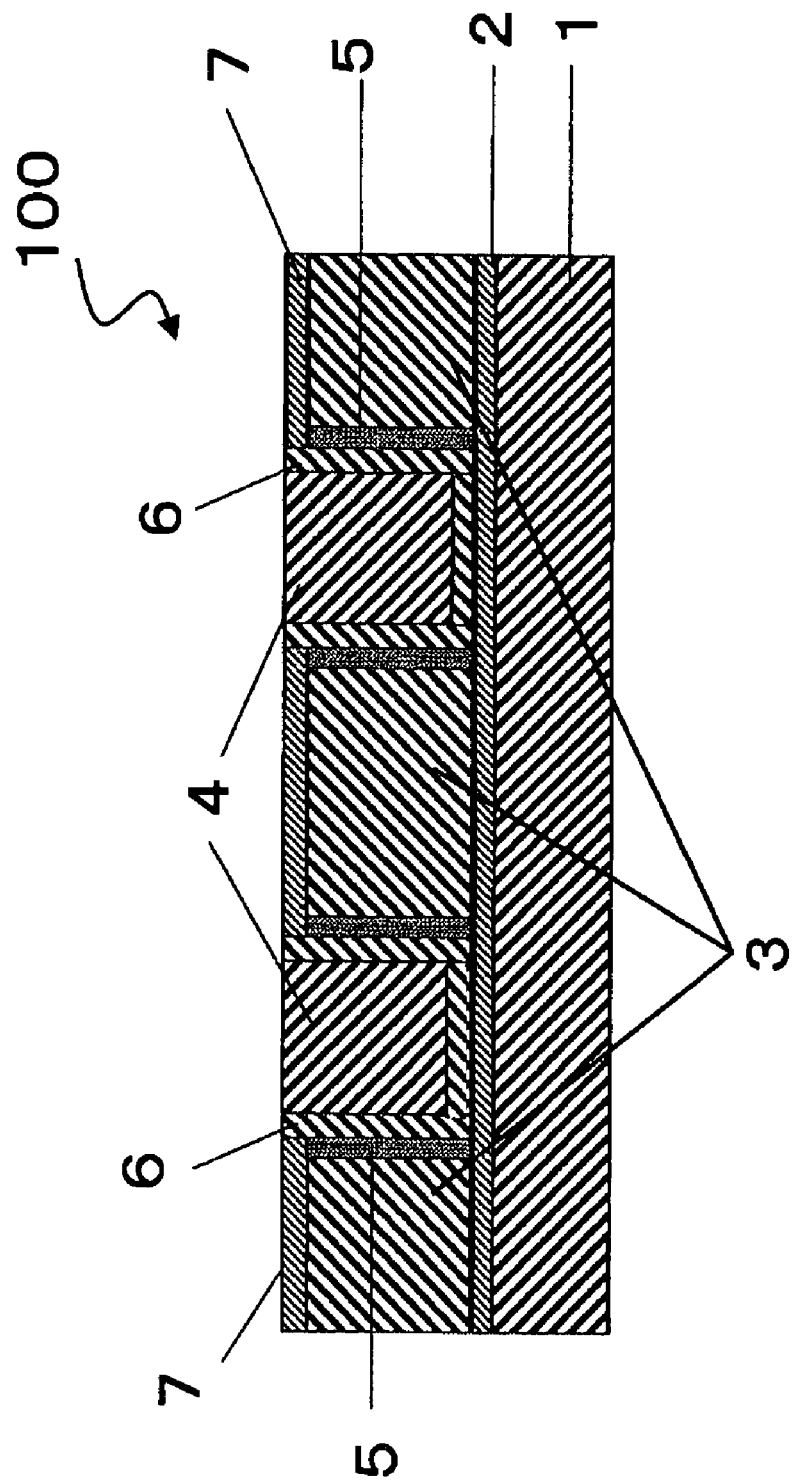
FIG. 1 is a sectional view showing an example of a semiconductor device of the present invention.

In the accompanying drawing, each sign refers to the following: 1: Semiconductor substrate; 2: a silicon nitride layer; 3: an interlayer insulation film; 4: a copper wiring layer; 5: a treated and modified layer; 6: a barrier layer; 7: a hard mask layer; and 100: a semiconductor device.

BEST MODE FOR CARRYING OUT THE INVENTION

Hereinafter, best modes for carrying out a resin composition, a polyimide resin composition, a polybenzoxazole resin composition, a resin film and a semiconductor device of the present invention will be described.

A resin composition of the present invention comprises a compound having a structure represented by the general formula (1). By using the resin composition, a resin film having excellent heat resistance and low dielectric constant can be obtained. The compound having a structure represented by the general formula (1) includes a polyimide resin precursor, a polybenzoxazole resin precursor or the like.

A compound having a structure represented by the general formula (1) which is used for the present invention has an aromatic group as "Ar" of the general formula (1). The aromatic group includes a phenyl group, a naphthyl group, an anthracenyl group, a phenanthrenyl group, a polycyclic aromatic group having 4 or more aromatic rings, a fluorenyl group, a diphenylfluorenyl group, a biphenyl group, a pyridyl group, a dipyridyl group, a nitrogen-containing polycyclic aromatic group and the like. The group having a structure represented by the general formula (2) is particularly preferred since it can give excellent solubility to a solvent used for producing a resin film or a semiconductor device comprising the resin film.

"Y" of the general formula (2) includes —O—, —S—, —OCO— and —COO—. Among them, —O— is particularly preferred in terms of solubility in a solvent and heat resistance.

Also, a compound having a structure represented by the general formula (1) has Ar-binding sites or $R_{11}$-binding sites as at least one of $R_1$ to $R_5$ and at least one of $R_6$ to $R_{10}$ on respective benzene rings. The others of $R_1$ to $R_5$ and $R_6$ to $R_{10}$ are each hydrogen, a group having an alicyclic structure, an organic group having 1 to 10 carbon atoms other than the group having an alicyclic structure, a hydroxyl group or a carboxyl group. Such a group having an alicyclic structure is the same as the group as $R_{11}$, which will be hereinafter described. The organic group having 1 to 10 carbon atoms other than the group having an alicyclic structure includes a methyl group, an ethyl group, a n-propyl group, an isopropyl group, a butyl group, an isobutyl group, a tert-butyl group, a heptyl group, a hexyl group, a pentyl group, an octyl group, a nonyl group, a decyl group, such organic groups substituted with fluorine such as a fluoromethyl group and the like.

A compound having a structure represented by the general formula (1) may contain hydrogen or an organic group having 1 or more carbon atoms as $R_{11}$. The organic group having 1 or more carbon atoms includes the group having an alicyclic structure, an organic group having 1 to 10 carbon atoms other than the group having an alicyclic structure and the like. When containing such an organic group, it is preferable to contain at least one group having an alicyclic structure. The group having an alicyclic structure contains a group having, for example, a cyclopropane structure, a cyclobutane structure, a cyclopentane structure, a cyclohexane structure, a cycloheptane structure, a norbornene structure, an adamantane structure and the like. Among them, a group having an adamantane structure is particularly preferred. The group having an adamantane structure is a group having an adamantane structure as a minimum unit and includes a group having an (aliphatic) polycyclic framework structure such as an adamantyl group, a diamantyl group, a triamantyl group, a tetramantyl group, a pentamantyl group, a hexamantyl group, a heptamantyl group, an octamantyl group, a nonamantyl group, a decamantyl group, and an undecamantyl group; a group having a plurality of the groups having a polycyclic framework structure; and the like. The group having a plurality of the groups having a polycyclic framework structure includes a group having an oligo structure, a group having a poly structure and the like. When the group having a polycyclic framework structure is an adamantyl group, there is, for example, a group having an oligoadamantane structure including a biadamantyl group such as a di(1,3-adamantane) group, and di(2,2-adamantane) group; a triadamantyl group such as a tri(1,3-adamantane) group, and tri(2,2-adamantane) group; a tetraadamantyl group such as a tetra(1,3-adamantane) group, and a tetra(2,2-adamantane) group; a pentaadamantyl group such as a penta(1,3-adamantane) group, and penta(2,2-adamantane) group; a heptaadamantyl group such as a hepta(1,3-adamantane) group, and hepta(2,2-adamantane) group; a hexaadamantyl group; an octaadamantyl group; a nonaadamantyl group; a decaadamantyl group; an undecaadamantyl group; a group having a polyadamantane structure having many adamantyl groups; and the like. When the group having a polycyclic framework structure is a group other than an adamantyl group, it includes the group having an oligoadamantane structure and the group having a polyadamantane structure of which adamantyl group is substituted. Specifically, it includes a group having a plurality of diamantane groups such as a bi-(diamantane) group, a tri-(diamantane) group, a tetra-(diamantane) group, a penta-(diamantane) group, a hexa-(diamantane) group, a hepta-(diamantane) group, an octa-(diamantane) group, a nona-(diamantane) group, a deca-(diamantane) group, and an undeca-(diamantane) group; a group having a plurality of triamantane groups such as a bi-(triamantane) group, a tri-(triamantane) group, a tetra-(triamantane) group, a penta-(triamantane) group, a hexa-(triamantane) group, a hepta-(triamantane) group, an octa-(triamantane) group, a nona-(triamantane) group, a deca-(triamantane) group, and an undeca-(triamantane) group; a group having a plurality of tetraamantane groups such as a bi-(tetraamantane) group, a tri-(tetraamantane) group, a tetra-(tetraamantane) group, a penta-(tetraamantane) group, a hexa-(tetraamantane) group, a hepta-(tetraamantane) group, an octa-(tetraamantane) group, a nona-(tetraamantane) group, a deca-(tetraamantane) group, and an undeca-(tetraamantane) group; and the like. Among them, preferred groups are an adamantyl group, a diamantyl group, a triamantyl group, a tetramantyl group, a pentamantyl group, a hexamantyl group, a heptamantyl group, an octamantyl group, a nonamantyl group, a decamantyl group, an undecamantyl group, a biadamantyl group, a triadamantyl group, a tetraadamantyl group, a pentaadamantyl group, a hexaadamantyl group, a heptaadamantyl group, an octaadamantyl group, a nonaadamantyl group, a decaadamantyl group and an undecaadamantyl group. More preferred groups are an adamantyl group, a diamantyl group, a triamantyl group, a tetramantyl group, a pentamantyl group, a di(1,3-adamantane) group, a tri(1,3-adamantane) group, a tetra(1,3-adamantane) group, a penta(1,3-adamantane) group, a di(2,2-adamantane) group, a tri(2,2-adamantane) group, a tetra(2,2-adamantane) group and a penta(2,2-adamantane) group. By introducing an adamantane structure as $R_{11}$, dielectric constant can be reduced and moisture resistance can be improved without reducing heat resistance and solubility in a solvent. An alkyl group such as a methyl group, an ethyl group, a propyl group, and a butyl group; a fluoroalkyl group such as a fluoromethyl group, a fluoroethyl group, a fluoropropyl group, and a fluorobutyl group; and the like may be bonded to the group having an adamantane structure. Solubility in a solvent and heat resistance can be improved by introducing an alkyl group to an adamantane structure.

It is preferable that an organic group having one or more carbon atoms other than a group having an alicyclic structure as $R_{11}$, is the same as an organic group having 1 to 10 carbon atoms as $R_1$ to $R_5$ and $R_6$ to $R_{10}$.

In a compound having a structure represented by the general formula (1), at least one of $R_{11}$, $R_1$ to $R_5$ and $R_6$ to $R_{10}$ is a group having an alicyclic structure. When there is no aromatic group as "Ar", at least one of $R_1$ to $R_5$ and $R_6$ to $R_{10}$ is the group having an alicyclic structure. In this case, dielectric constant can be further reduced and heat resistance, especially a glass-transition temperature, becomes more excellent.

A compound having a structure represented by the general formula (1) has any of —O—, —NHCO—, —CONH—, —COO— and —OCO— as "X".

A compound having a structure represented by the general formula (1) of the present invention can be used as polyphenylene ether when "X" is —O— in the formula. It can be used as polyamide when "X" is —NHCO— or —CONH. And it can be used as polyester when "X" is —COO— or —OCO—.

In said structure, particularly in the case of polyamide, a compound having a structure represented by the general formula (1) is a polyimide resin precursor structure when $R_2$ or $R_3$ and $R_7$ or $R_8$ are each a carboxyl group. When $R_2$ or $R_3$ and $R_7$ or $R_8$ are each a hydroxyl group, a compound having a structure represented by the general formula (1) is a polybenzoxazole resin precursor structure. Heat resistance can be further improved by choosing such structure. For example, there is a structure that $R_7$ or $R_8$ is a hydroxyl group, $R_2$ or $R_3$ is an amino group, $R_6$ or $R_9$, and $R_5$ have an alicyclic structure each, and "Ar" bonds to $R_1$ or $R_4$, and $R_{10}$ when "X" is —NHCO— in the formula.

When the compound having a structure represented by the general formula (1) is a polyimide resin precursor structure, it can become a polyimide resin by dehydrating and closing rings thereof.

When the compound having a structure represented by the general formula (1) is a polybenzoxazole resin precursor structure, it can become a polybenzoxazole resin by dehydrating and closing rings thereof.

In a method for preparing the polyimide resin precursor, for example, the polyimide resin precursor can be obtained by the reaction of tetracarboxylic acid dianhydride with diamine compound. Acid dianhydride may be half-esterified with alcohols before it is reacted with diamine compound.

The tetracarboxylic acid dianhydride having an alicyclic structure includes a compound having a structure represented by the following general formula (3):

[Chemical formula 3]

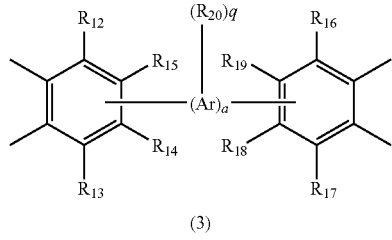

(3)

wherein, "Ar" is an aromatic group; "a" is 0 or 1; $R_{20}$ is hydrogen or an organic group having one or more carbon atoms; when "q" is an integer of 2 or more, $R_{20}$s may be the same or different from each other; at least one of $R_{12}$ to $R_{15}$ and at least one of $R_{16}$ to $R_{19}$ on respective benzene rings are Ar-binding sites or $R_{20}$-binding sites and the others of $R_{12}$ to $R_{15}$ and $R_{16}$ to $R_{19}$ are each hydrogen, a group having an alicyclic structure or an organic group having 1 to 10 carbon atoms other than the group having an alicyclic structure; at least one of $R_{20}$, $R_{12}$ to $R_{15}$ and $R_{16}$ to $R_{19}$ is a group having an alicyclic structure; "q" is an integer of 1 or more; and the aromatic group, the organic group having one or more carbon atoms, the group having an alicyclic structure, the organic group having 1 to 10 carbon atoms other than the group having an alicyclic structure are the same as those in the general formula (1).

A specific example of the tetracarboxylic acid dianhydride having an alicyclic structure includes: tetracarboxylic acid dianhydride having an adamantane structure and a fluorene structure such as 9,9-bis(3,4-dicarboxyphenyl)-2,7-diadamantyl-fluorene-dianhydride, 9,9-bis[4-(3,4-dicarboxyphenoxy)-phenyl]-2,7-diadamantyl-fluorene-dianhydride, and 9,9-bis[4-(3,4-dicarboxy-5-adamantylphenoxy)-phenyl]-fluorene-dianhydride; tetracarboxylic acid dianhydride having an adamantane structure and a benzene structure such as 1,3-bis(3,4-dicarboxyphenoxy)-4,6-diadamantyl-benzene-dianhydride, and 1,3-bis(3,4-dicarboxy-5-adamantylphenoxy)-benzene-dianhydride; tetracarboxylic acid dianhydride having an adamantane structure and a naphthalene structure; tetracarboxylic acid dianhydride having an adamantane structure and an anthracene structure; tetracarboxylic acid dianhydride having an adamantane structure and a biphenyl structure such as 2,2'-bis(3,4-dicarboxyphenoxy)-5,5'-diadamantyl-biphenyl-dianhydride, and 2,2'-bis(3,4-dicarboxy-5-adamantylphenoxy)-biphenyl-dianhydride; and the like. An adamantane structure of a group having an alicyclic structure may be selected from the above-mentioned structures having an adamantane structure as a minimum unit. A binding position of an adamantane structure may be optionally selected from the range specified by the general formula (1).

In the case of using a diamine compound containing a group having an alicyclic structure, tetracarboxylic acid dianhydrides containing no group having an alicyclic structure can be used. The tetracarboxylic acid dianhydride containing no group having an alicyclic structure includes 9,9-bis(3,4-dicarboxyphenyl)fluorene-dianhydride, 9,9-bis[4-(3,4-dicarboxyphenoxy)-phenyl]fluorene-dianhydride, 1,3-bis(3,4-dicarboxyphenoxy)benzene-dianhydride, 2,2'-bis((3,4-dicarboxyphenoxy)biphenyl-dianhydride and the like.

The tetracarboxylic acid dianhydride having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction followed by a fluorenation reaction and a fluorenonation reaction to synthesize corresponding 2,7-diadamantylfluorenone. The corresponding 2,7-diadamantylfluorenone and o-xylene undergo a dehydration reaction followed by an oxidation reaction of a methyl group to make a phthalic acid structure. Next, a dehydration reaction using acetic anhydride or the like is performed thereon, thus synthesizing 9,9-bis(3,4-dicarboxy-phenyl)-2,7-diadamantyl-fluorene dianhydride. Also, 9,9-bis[(3,4-dicarboxy-phenoxy)-phenyl]-2,7-diadamantyl-fluorene dianhydride can be synthesized by the following steps. Firstly, fluorene bisphenol having an adamantyl group is obtained by a dehydration reaction of 2,7-diadamantyl fluorenone and phenol. Fluorene bisphenol thus obtained is reacted with 4-fluoro-dimethyl phthalate to be etherified. Further, it undergoes alkaline hydrolysis and acid treatment to make a phthalate structure. Next, a dehydration reaction using acetic anhydride or the like is performed thereon.

The tetracarboxylic acid dianhydride having an adamantane structure and a benzene structure may be synthesized by the following method, for example. Firstly, dihydroxybenzene having an adamantane structure is synthesized by the reaction of resorcinol with 1-bromoadamantane. It is etherified with 4-fluoro-dimethyl phthalate. Further, it undergoes alkaline hydrolysis and acid treatment to make a phthalate structure. Next, a dehydration reaction using acetic anhydride or the like is performed thereon, thus synthesizing 1,3-bis(3,4-dicarboxy-phenoxy)-4,6-diadamantyl-benzene dianhydride.

The tetracarboxylic acid dianhydride having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane. It is etherified with 4-fluoro-dimethyl phthalate. Further, it undergoes alkaline hydrolysis and acid treatment to make a phthalate structure. Next, a dehydration reaction using acetic anhydride or the like is performed thereon, thus synthesizing 2,2'-bis(3,4-dicarboxy-phenoxy)-5,5'-diadamantyl-biphenyl dianhydride.

The diamine compound having an alicyclic structure includes a compound having a structure represented by the following general formula (4):

[Chemical formula 4]

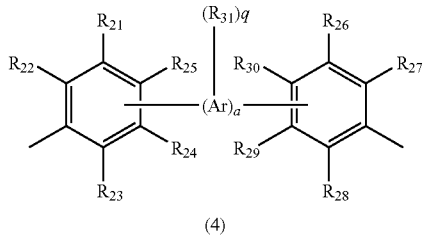

(4)

wherein, "Ar" is an aromatic group; "a" is 0 or 1; $R_{31}$ is hydrogen or an organic group having one or more carbon atoms and when "q" is an integer of 2 or more, $R_{31}$s may be the same or different from each other; at least one of $R_{21}$ to $R_{25}$ and at least one of $R_{26}$ to $R_{30}$ on respective benzene rings are Ar-binding sites or $R_{31}$-binding sites and the others of $R_{21}$ to $R_{25}$ and $R_{26}$ to $R_{30}$ are each hydrogen, a group having an alicyclic structure or an organic group having 1 to 10 carbon atoms other than the group having an alicyclic structure; at least one of $R_{31}$, $R_{21}$ to $R_{25}$ and $R_{26}$ to $R_{30}$ is a group having an alicyclic structure; "q" is an integer of 1 or more; the aromatic group, the organic group having one or more carbon atoms, the group having an alicyclic structure, the organic group having 1 to 10 carbon atoms other than the group having an alicyclic structure are the same as those in the general formula (1).

A specific example of the diamine compound having an alicyclic structure includes: a diamine compound having an adamantane structure and a fluorene structure such as 2,7-di (1-adamantyl)-fluorene-9,9-bis(4-aniline), 9,9-bis(4-amino-5-adamantylphenyl)-fluorene, and 9,9-bis[(4-aminophenoxy)-phenyl]-2,7-diadamantyl-fluorene; a diamine compound having an adamantane structure and a benzene structure such as 4,6-di(1-adamantyl)-1,3-bis(4-aminophenoxy)-benzene, and 1,3-bis(4-amino-5-adamantylphenoxy)-benzene; a diamine compound having an adamantane structure and a naphthalene structure; a diamine compound having an adamantane structure and an anthracene structure; a diamine compound having an adamantane structure and a biphenyl structure such as 2,2'-bis(4-aminophenoxy)-5,5'-di (1-adamantyl)-biphenyl, and 2,2'-bis(4-amino-5-adamantylphenoxy)-biphenyl; and the like. An adamantane structure of a group having an alicyclic structure may be selected from the above-mentioned structures having an adamantane structure as a minimum unit. A binding position thereof may be optionally selected from the range specified by the general formula (1).

In the case of using tetracarboxylic acid dianhydride containing a group having an alicyclic structure, diamine compound containing no group having an alicyclic structure can be used. The diamine compound containing no group having an alicyclic structure includes 9,9-bis(4-aniline)fluorene, 9,9-bis[(4-aminophenoxy)-phenyl]fluorene, 1,3-bis(4-aminophenoxy)-benzene, 2,2'-bis(4-aminophenoxy)biphenyl and the like.

In a combination of the tetracarboxylic acid dianhydride and diamine compound, each of those are preferred to have a group having an alicyclic structure to obtain a polyimide resin with lower dielectric constant and excellent heat resistance.

The diamine compound having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction followed by a fluorenation reaction and a fluorenonation reaction to synthesize corresponding 2,7-diadamantyl fluorenone. The corresponding 2,7-diadamantyl fluorenone is subject to a dehydration reaction with aniline, thus synthesizing 9,9-bis(4-amino-phenyl)-2,7-di(1-adamantyl)-fluorene. Also, 9,9-bis[(4-aminophenoxy)-phenyl]-2,7-di(1-adamantyl)-fluorene can be synthesized by the following steps. Firstly, fluorene bisphenol having an adamantyl group is obtained by a dehydration reaction of 2,7-diadamantyl fluorenone and phenol. Fluorene bisphenol thus obtained is etherified with 4-fluoro-nitrobenzene. Further, it undergoes a reduction reaction.

The diamine compound having an adamantane structure and a benzene structure may be synthesized by the following method, for example. Firstly, dihydroxy benzene having an adamantane structure is synthesized by the reaction of resorcinol with 1-bromoadamantane. Dihydroxy benzene thus obtained is etherified with 4-fluoro-nitrobenzene. Further, it undergoes a reduction reaction, thus synthesizing 4,6-di(1-adamantyl)-1,3-bis(4-aminophenoxy)-benzene.

The diamine compound having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane. Dihydroxy-biphenyl thus obtained is etherified with 4-fluoro-nitrobenzene. Further, it undergoes a reduction reaction, thus synthesizing 2,2'-bis(4-aminophenoxy)-5,5'-di(1-adamantyl)-biphenyl.

In these syntheses, a tetracarboxylic acid dianhydride and a diamine compound other than the above-mentioned tetracarboxylic acid dianhydride and diamine compound may be used for copolymerization or blending.

In a method of preparing the polybenzoxazole resin precursor, for example, the polybenzoxazole resin precursor can be obtained by the reaction of a bis o-aminophenol compound with a dicarboxylic acid compound using the acid chloride method, active ester method, or the like.

The bis-o-aminophenol compound having an alicyclic structure includes a compound having a structure represented by the general formula (3).

A specific example of the bis o-aminophenol compound having an alicyclic structure includes: a bisaminophenol compound having an adamantane structure and a fluorene structure such as 9,9-bis(3-amino-4-hydroxy-phenyl)-2,7-di (1-adamantyl)-fluorene, 9,9-bis(3-amino-4-hydroxy-5-adamantylphenyl)-fluorene, 9,9-bis(3-amino-4-hydroxy-phenyl)-2,7-di(3,5-dimethyl-1-adamantyl)-fluorene, 9,9-bis[(3-hydroxy-4-aminophenoxy)-phenyl]-2,7-di(1-adamantyl)- fluorene, 9,9-bis[(3-hydroxy-4-amino-5-adamantylphenoxy)-phenyl]-fluorene, 9,9-bis[(3-hydroxy-4-aminophenoxy)-phenyl]-2,7-di(3,5-dimethyl-1-adamantyl)adamantyl-fluorene, and 9,9-bis[4-(4-amino-3-hydroxy-6-adamantyl-phenoxy)-phenyl]-2,7-fluorene; a bisaminophenol compound having an adamantane structure and a benzene structure such as 1,3-bis(3-hydroxy-4-aminophenoxy)-4,6-diadamantyl benzene, 1,3-bis(3-hydroxy-4-amino-5-adamantylphenoxy)-benzene, 4,6-di(1-adamantyl)-1,3-bis(4-amino-3-hydroxyphenoxy)benzene, 4,6-di(3,5-dimethyl-1-adamantyl)-1,3-bis(4-amino-3-hydroxyphenoxy)benzene, 4,6-di(3-(3,5-dimethyl-1-adamantyl)-(3,5-dimethyl-1-adamantyl))-1,3-bis(4-amino-3-hydroxyphenoxy)benzene, 1,3-bis(4-amino-3-hydroxy-6-adamantyl-phenoxy)benzene, and 4,6-di(1-adamantyl)-1,3-bis(4-amino-3-hydroxy-6-adamantyl-phenoxy)benzene; a bisaminophenol compound having an adamantane structure and a naphthalene structure; a bisaminophenol compound having an adamantane structure and an anthracene structure; a bisaminophenol compound having an adamantane structure and a biphenyl structure such as 2,2'-dihydroxy-3,3'-diamino-5,5'-diadamantyl-biphenyl, 2,2'-dihydroxy-3,3'-diamino-5,5'-bis(3,5-dimethyl-1-adamantyl)-biphenyl, 2,2'-dihydroxy-3,3'-diamino-5,5'-bis(3-(5,7-dimethyl-1-adamantyl)-(3,5-dimethyl-1-adamantyl))biphenyl, 2,2'-bis(3-hydroxy-4-aminophenoxy)-5,5'-diadamantyl-biphenyl, 2,2'-bis(3-hydroxy-4-amino-5-adamantylphenoxy)-biphenyl, 2,2'-bis[4-(3-hydroxy-4-amino)phenoxy]-5,5'-bis(3-(3,5-dimethyl-1-adamantyl)biphenyl), 2,2'-bis[4-(3-hydroxy-4-amino)phenoxy-phenyl]-5,5'-bis(3-(3,5-dimethyl-1-adamantyl)biphenyl, 2,2'-bis[4-(4-amino-3-hydroxy-6-adamantyl)phenoxy]-biphenyl, and 2,2'-bis[4-(4-amino-3-hydroxy-6-adamantyl)phenoxy]-5,5'-bis(1-adamantyl)biphenyl; and the like. An adamantane structure of a group having an alicyclic structure may be selected from the above-mentioned structures having an adamantane structure as a minimum unit. A binding position thereof may be optionally selected from the range specified by the general formula (1).

In the case of using a dicarboxylic acid compound containing a group having an alicyclic structure, the bis o-aminophenol compounds containing no group having an alicyclic structure can be used. The bis o-aminophenol compound having no group having an alicyclic structure includes 9,9-bis(3-amino-4-hydroxy-phenyl)fluorene, 9,9-bis(3-amino-4-hydroxy-phenyl)fluorene, 1,3-bis(3-hydroxy-4-aminophenoxy)benzene, 1,3-bis(4-amino-3-hydroxyphenoxy)benzene, 2,2'-dihydroxy-3,3'-diaminobiphenyl, 2,2'-bis[4-(3-hydroxy-4-amino)phenoxy]biphenyl and the like.

The bisaminophenol compound having an adamantane structure and a fluorene structure may be synthesized by the following method, for example. Firstly, 2-bromo-5-(1-adamantyl)-toluene and 4-(1-adamantyl)-benzeneboronic acid undergo a Suzuki coupling reaction followed by a fluorenation reaction and a fluorenonation reaction to synthesize a corresponding 2,7-diadamantylfluorenone. The corresponding 2,7-diadamantylfluorenone is subject to a dehydration reaction with phenol to obtain fluorene bisphenol having an adamantyl group. Nitration of an ortho position of a hydroxyl group is performed on the obtained fluorene bisphenol. Next, it is reduced to an amino group, thus synthesizing 9,9-bis(3-amino-4-hydroxy-phenyl)-2,7-diadamantyl-fluorene. Also, the obtained fluorene bisphenol having an adamantyl group is etherified with 2-benzyloxy-4-fluoro-nitrobenzene. Further, it undergoes deprotection and a reduction reaction, thus synthesizing 9,9-bis[(3-hydroxy-4-aminophenoxy)-phenyl]-2,7-diadamantyl-fluorene.

The bisaminophenol compound having an adamantane structure and a benzene structure may be synthesized by the following method, for example. Firstly, dihydroxybenzene having an adamantane structure is synthesized by the reaction of resorcinol with 1-bromoadamantane or 1-bromo-3,5-dimethyladamantane. Dihydroxybenzene thus obtained is etherified with 2-benzyloxy-4-fluoro-nitrobenzene. Further, it undergoes deprotection and a reduction reaction, thus synthesizing 1,3-bis(3-hydroxy-4-aminophenoxy)-4,6-diadamantyl-benzene or 4,6-di(3,5-dimethyl-1-adamantyl)-1,3-bis(4-amino-3-hydroxyphenoxy)benzene.

The bisaminophenol compound having an adamantane structure and biphenyl structure may be synthesized by the following method, for example. Firstly, dihydroxy-biphenyl having an adamantyl group is synthesized by the reaction of 2,2'-dihydroxy-biphenyl with 1-bromoadamantane or 1-bromo-3,5-dimethyladamantane. Nitration of an ortho position of a hydroxyl group is performed on the obtained dihydroxy-biphenyl. Next, it is reduced to an amino group, thus synthesizing 2,2'-dihydroxy-3,3'-diamino-5,5'-diadamantyl-biphenyl or 2,2'-dihydroxy-3,3'-diamino-5,5'-di(3,5-dimethyl-1-adamantyl)-biphenyl.

Also, 2,2'-bis(3-hydroxy-4-aminophenoxy)-5,5'-diadamantyl-biphenyl or 4,6-di(3,5-dimethyl-1-adamantyl)-1,3-bis(4-amino-3-hydroxyphenoxy)benzene can be synthesized by etherifying the obtained dihydroxy-biphenyl having an adamantyl group with 2-benzyloxy-4-fluoro-nitrobenzene and performing deprotection and a reduction reaction thereon.

The dicarboxylic acid compound having an alicyclic structure includes a compound having a structure represented by the general formula (4).

A specific example of the dicarboxylic acid compound having an alicyclic structure includes: dicarboxylic acid having an adamantane structure and a fluorene structure such as 2,7-diadamantylfluorene-9,9-bis benzoic acid, 9,9-bis(4-carboxy-3-adamantylphenyl)fluorene, 2,7-di(3,5-dimethyl-1-adamantyl)fluorene-9,9-bis benzoic acid, 9,9-bis(4-carboxy-phenyl)-2,7-diadamantyl-fluorene, 9,9-bis(4-carboxy-phenyl)-2,7-di(3,5-dimethyl-1-adamantyl)-fluorene, 9,9-bis[(4-carboxy-phenoxy)-phenyl]-2,7-diadamantyl-fluorene, 9,9-bis[(4-carboxy-3-adamantylphenoxy)-phenyl]-fluorene, and 9,9-bis[(4-carboxy-phenoxy)-phenyl]-2,7-di(3,5-dimethyl-1-adamantyl)-fluorene; dicarboxylic acid having an adamantane structure and a benzene structure such as 4,6-di[(3-(5,7-dimethyl-1-adamantyl)-(3,5-dimethyl-1-adamantyl))-1,3-bis(4-carboxy-phenoxy)benzene, 1,3-bis(4-carboxy-3-adamantylphenoxy)benzene, 1,3-bis(4-carboxyl-phenoxy)-4,6-diadamantyl-benzene, and 1,3-bis(4-carboxyl-phenoxy)-4,6-di(3,5-dimethyl-1-adamantyl)-benzene; dicarboxylic acid having an adamantane structure and a naphthalene structure; dicarboxylic acid having an adamantane structure and an anthracene structure; dicarboxylic acid having an adamantane structure and a biphenyl structure such as 2,2'-bis[(4-carboxy-phenoxy)-phenyl]-5,5'-bis[3-(1-adamantyl)-(1-adamantyl)]-biphenyl, 2,2'-bis[(4-carboxy-3-adamantylphenoxy)-phenyl]-biphenyl, 2,2'-bis(4-carboxy-phenoxy)-5,5'-diadamantyl-biphenyl, and 2,2'-bis(4-carboxy-phenoxy)-5,5'-di(3,5-dimethyl-1-adamantyl)-biphenyl; phthalic acid having an adamantane structure and an ethynyl structure such as 3-(2-(1-adamantyl)ethynyl)phthalic acid, 3-(2-(2-adamantyl)ethynyl)phthalic acid, 4-(2-(1-adamantyl)ethynyl)phthalic acid, 4-(2-(2-adamantyl)ethynyl)phthalic acid, 3-(2-(1-(3,5-dimethyladamantyl))ethynyl)phthalic acid, 3-(2-(2-(1,3-dimethyladamantyl))ethynyl)phthalic acid, 4-(2-(1-(3,5-dimethyladamantyl))ethynyl)phthalic acid, and 4-(2-(2-(1,3-dimethyladamantyl))ethynyl)phthalic acid; isophthalic acid having an adamantane structure and an ethynyl structure such as 4-(2-(1-adamantyl)ethynyl)isophthalic acid, 4-(2-(2-adamantyl)ethynyl)isophthalic acid, 5-(2-(1-adamantyl)ethynyl)isophthalic acid, 5-(2-(2-adamantyl)ethynyl)isophthalic acid, 4-(2-(1-(3,5-dimethyladamantyl))ethynyl)isophthalic acid, 4-(2-(2-(1,3-dimethyladamantyl))ethynyl)isophthalic acid, 5-(2-(1-(3,5-dimethyladamantyl))ethynyl)isophthalic acid, and 5-(2-(2-(1,3-dimethyladamantyl))ethynyl)isophthalic acid; terephthalic acid having an adamantane structure and an ethynyl structure such as 5-(2-(1-adamantyl)ethynyl)terephthalic acid, 5-(2-(2-adamantyl)ethynyl)terephthalic acid, 5-(2-(1-(3,5-dimethyladamantyl))ethynyl)terephthalic acid, 5-(2-(2-(1,3-dimethyladamantyl))ethynyl)terephthalic acid and the like; phthalic acid having an diamantyl structure and an ethynyl structure such as 3-(2-(1-diamantyl)ethynyl)phthalic acid, 3-(2-(2-diamantyl)ethynyl)phthalic acid, 4-(2-(1-diamantyl)ethynyl)phthalic acid, and 4-(2-(2-diamantyl)ethynyl)phthalic acid; isophthalic acid having a diamantyl structure and an ethynyl structure such as 4-(2-(1-diamantyl)ethynyl)isophthalic acid, 4-(2-(2-diamantyl)ethynyl)isophthalic acid, 5-(2-(1-diamantyl)ethynyl)isophthalic acid, and 5-(2-(2-diamantyl)ethynyl)isophthalic acid; terephthalic acid having a diamantyl structure and an ethynyl structure such as 5-(2-(1-diamantyl)ethynyl)terephthalic acid, and 5-(2-(2-diamantyl)ethynyl)terephthalic acid; phthalic acid having a tetramantyl structure and an ethynyl structure such as 3-(2-(1-tetramantyl)ethynyl)phthalic acid, 3-(2-(2-tetramantyl)ethynyl)phthalic acid, 4-(2-(1-tetramantyl)ethynyl)phthalic acid, and 4-(2-(2-tetramantyl)ethynyl)phthalic acid; isophthalic acid having a tetramantyl structure and an ethynyl structure such as 4-(2-(1-tetramantyl)ethynyl)isophthalic acid, 4-(2-(2-tetramantyl)ethynyl)isophthalic acid, 5-(2-(1-tetramantyl)ethynyl)isophthalic acid, and 5-(2-(2-tetramantyl)ethynyl)isophthalic acid; terephthalic acid having a tetramantyl structure and an ethynyl structure such a 5-(2-(1-tetramantyl)ethynyl)terephthalic acid, and 5-(2-(2-tetramantyl)ethynyl)terephthalic acid; isophthalic acid having a biadamantyl structure and an ethynyl structure such as 3-(2-(3-(1,1'-biadamantyl))ethynyl)phthalic acid, 3-(2-(2-(1,1'-biadamantyl))ethynyl)phthalic acid, 4-(2-(3-(1,1-biadamantyl))ethynyl)phthalic acid, 4-(2-(2-(1,1'-biadamantyl))ethynyl)phthalic acid, 3-(2-(7-(1,1'-(3,5,3',5'-tetramethyl biadamantyl)))ethynyl)phthalic acid, 3-(2-(2-(1,1'-(3,5,3',5'-tetramethyl biadamantyl)))ethynyl)phthalic acid, 4-(2-(7-(1,1'-(3,5,3',5'-tetramethyl biadamantyl)))ethynyl)phthalic acid, and 4-(2-(2-(1,1'-(3,5,3',5'-tetramethyl biadamantyl)))ethynyl)phthalic acid; isophthalic acid having a biadamantyl structure and an ethynyl structure such as 4-(2-(3-(1,1'-biadamantyl))ethynyl)isophthalic acid, 4-(2-(2-(1,1'-biadamantyl))ethynyl)isophthalic acid, 5-(2-(3-(1,1'-biadamantyl))ethynyl)isophthalic acid, 5-(2-(2-(1,1'-biadamantyl))ethynyl)isophthalic acid, 4-(2-(7-(1,1'-(3,5,3',5'-tetramethyl biadamantyl)))ethynyl)isophthalic acid, 4-(2-(2-(1,1'-(3,5,3',5'-tetramethyl biadamantyl)))ethynyl)isophthalic acid, 5-(2-(7-(1,1'-(3,5,3',5'-tetramethyl biadamantyl)))ethynyl)isophthalic acid, and 5-(2-(2-(1,1'-(3,5,3',5'-tetramethyl biadamantyl)))ethynyl)isophthalic acid; terephthalic acid having a biadamantyl structure and an ethynyl structure such as 5-(2-(3-(1,1'-biadamantyl))ethynyl)terephthalic acid, 5-(2-(2-(1,1'-biadamantyl))ethynyl)terephthalic acid, 5-(2-(7-(1,1'-(3,5,3',5'-tetramethyl biadamantyl)))ethynyl)terephthalic acid, and 5-(2-(2-(1,1'-(3,5,3',5'-tetramethyl biadamantyl)))ethynyl)terephthalic acid; phthalic acid having an adamantyl structure and a phenylethynyl structure such as 3-(2-(4-(1-adamantyl)phenyl)ethynyl)phthalic acid, 3-(2-(4-(2-adamantyl)phenyl)ethynyl)phthalic acid, 4-(2-(4-(1-adamantyl)phenyl)ethynyl)phthalic acid, 4-(2-(4-(2-adamantyl)phenyl)ethynyl)phthalic acid, 3-(2-(4-(1-(3,5-dimethyladamantyl))phenyl)ethynyl)phthalic acid, 3-(2-(4-(2-(1,3-dimethyladamantyl))phenyl)ethynyl)phthalic acid, 4-(2-(4-(1-(3,5-dimethyladamantyl))phenyl)ethynyl)phthalic acid, 4-(2-(4-(2-(1,3-dimethyladamantyl))phenyl)ethynyl)phthalic acid, 3-(2-(4-(4-(1-adamantyl)phenoxy)phenyl)ethynyl)phthalic acid, 3-(2-(4-(4-(2-adamantyl)phenoxy)phenyl)ethynyl)phthalic acid, 4-(2-(4-(4-(1-adamantyl)phenoxy)phenyl)ethynyl)phthalic acid, 4-(2-(4-(4-(2-adamantyl)phenoxy)phenyl)ethynyl)phthalic acid, 3-(2-(4-(4-(1-(3,5-dimethyladamantyl))phenoxy)phenyl)ethynyl)phthalic acid, 3-(2-(4-(4-(2-(1,3-dimethyladamantyl))phenoxy)phenyl)ethynyl)phthalic acid, 4-(2-(4-(4-(1-(3,5-dimethyladamantyl))phenoxy)phenyl)ethynyl)phthalic acid, and 4-(2-(4-(4-(2-(1,3-dimethyladamantyl))phenoxy)phenyl)ethynyl)phthalic acid; isophthalic acid having an adamantyl structure and a phenylethynyl structure such as 4-(2-(4-(1-adamantyl)phenyl)ethynyl)isophthalic acid, 4-(2-(4-(2-adamantyl)phenyl)ethynyl)isophthalic acid, 5-(2-(4-(1-adamantyl)phenyl)ethynyl)isophthalic acid, 5-(2-(4-(2-adamantyl)phenyl)ethynyl)isophthalic acid, 4-(2-(4-(1-(3,5-dimethyladamantyl))phenyl)ethynyl)isophthalic acid, 4-(2-(4-(2-(1,3-dimethyladamantyl))phenyl)ethynyl)isophthalic acid, 5-(2-(4-(1-(3,5-dimethyladamantyl))phenyl)ethynyl)isophthalic acid, 5-(2-(4-(2-(1,3-dimethyladamantyl))phenyl)ethynyl)isophthalic acid, 4-(2-(4-(4-(1-adamantyl)phenoxy)phenyl)ethynyl)isophthalic acid, 4-(2-(4-(4-(2-adamantyl)phenoxy)phenyl)ethynyl)isophthalic acid, 5-(2-(4-(4-(1-adamantyl)phenoxy)phenyl)ethynyl)isophthalic acid, 5-(2-(4-(4-(2-adamantyl)phenoxy)phenyl)ethynyl)isophthalic acid, 5-(2-(4-(4-(1-(3,5-dimethyladamantyl))phenoxy)phenyl)ethynyl)isophthalic acid, 4-(2-(4-(4-(2-(1,3-dimethyladamantyl))phenoxy)phenyl)ethynyl)isophthalic acid, 5-(2-(4-(4-(1-(3,5-dimethyladamantyl))phenoxy)phenyl)ethynyl)isophthalic acid, and 5-(2-(4-(4-(2-(1,3-dimethyladamantyl))phenoxy)phenyl)ethynyl)isophthalic acid; terephthalic acid having an adamantyl structure and a phenylethynyl structure such as 5-(2-(4-(1-adamantyl)phenyl)ethynyl)terephthalic acid, 5-(2-(4-(2-adamantyl)phenyl)ethynyl)terephthalic acid, 5-(2-(4-(1-(3,5-dimethyladamantyl))phenyl)ethynyl)terephthalic acid, 5-(2-(4-(2-(1,3-dimethyladamantyl))phenyl)ethynyl)terephthalic acid, 5-(2-(4-(4-(1-adamantyl)phenoxy)phenyl)ethynyl)terephthalic acid, 5-(2-(4-(4-(2-adamantyl)phenoxy)phenyl)ethynyl)terephthalic acid, 5-(2-(4-(4-(1-(3,5-dimethyladamantyl))phenoxy)phenyl)ethynyl)terephthalic acid, and 5-(2-(4-(4-(2-(1,3-dimethyladamantyl))phenoxy)phenyl)ethynyl)terephthalic acid; phthalic acid having a diamantyl structure and a phenylethynyl structure such as 3-(2-(4-(1-diamantyl)phenyl)ethynyl)phthalic acid, 3-(2-(4-(2-diamantyl)phenyl)ethynyl)phthalic acid, 4-(2-(4-(1-diamantyl)phenyl)ethynyl)phthalic acid, 4-(2-(4-(2-diamantyl)phenyl)ethynyl)phthalic acid, 3-(2-(4-(4-(1-diamantyl)phenoxy)phenyl)ethynyl)phthalic acid, 3-(2-(4-(4-(2-diamantyl)phenoxy)phenyl)ethynyl)phthalic acid, 4-(2-(4-(4-(1-diamantyl)phenoxy)phenyl)ethynyl)phthalic acid, and 4-(2-(4-(4-(2-diamantyl)phenoxy)phenyl)ethynyl)phthalic acid; isophthalic acid having a diamantyl structure and a phenylethynyl structure such as 4-(2-(4-(1-diamantyl)phenyl)ethynyl)isophthalic acid, 4-(2-(4-(2-diamantyl)phenyl)ethynyl)isophthalic acid, 5-(2-(4-(1-diamantyl)phenyl)ethynyl)isophthalic acid, 5-(2-(4-(2-diamantyl)phenyl)ethynyl)isophthalic acid, 4-(2-(4-(4-(1-diamantyl)phenoxy)phenyl)ethynyl)isophthalic acid, 4-(2-(4-(4-(2-diamantyl)phenoxy)phenyl)ethynyl)isophthalic acid, 5-(2-(4-(4-(1-diamantyl)phenoxy)phenyl)ethynyl)isophthalic acid, and 5-(2-(4-(4-(2-diamantyl)phenoxy)phenyl)ethynyl)isophthalic acid; terephthalic acid having a diamantyl structure and a phenylethynyl structure such as 5-(2-(4-(1-diamantyl)phenyl)ethynyl)terephthalic acid, 5-(2-(4-(2-diamantyl)phenyl)ethynyl)terephthalic acid, 5-(2-(4-(4-(1-diamantyl)phenoxy)phenyl)ethynyl)terephthalic acid, and 5-(2-(4-(4-(2-diamantyl)phenoxy)phenyl)ethynyl)

terephthalic acid; phthalic acid having a tetramantyl structure and a phenylethynyl structure such as 3-(2-(4-(1-tetramantyl)phenyl)ethynyl)phthalic acid, 3-(2-(4-(2-tetramantyl)phenyl)ethynyl)phthalic acid, 4-(2-(4-(1-tetramantyl)phenyl)ethynyl)phthalic acid, 4-(2-(4-(2-tetramantyl)phenyl)ethynyl)phthalic acid, 3-(2-(4-(4-(1-tetramantyl)phenoxy)phenyl)ethynyl)phthalic acid, 3-(2-(4-(4-(2-tetramantyl)phenoxy)phenyl)ethynyl)phthalic acid, 4-(2-(4-(4-(1-tetramantyl)phenoxy)phenyl)ethynyl)phthalic acid, and 4-(2-(4-(4-(2-tetramantyl)phenoxy)phenyl)ethynyl)phthalic acid; isophthalic acid having a tetramantyl structure and a phenylethynyl structure such as 4-(2-(4-(1-tetramantyl)phenyl)ethynyl)isophthalic acid, 4-(2-(4-(2-tetramantyl)phenyl)ethynyl)isophthalic acid, 5-(2-(4-(1-tetramantyl)phenyl)ethynyl)isophthalic acid, 5-(2-(4-(2-tetramantyl)phenyl)ethynyl)isophthalic acid, 4-(2-(4-(4-(1-tetramantyl)phenoxy)phenyl)ethynyl)isophthalic acid, 4-(2-(4-(4-(2-tetramantyl)phenoxy)phenyl)ethynyl)isophthalic acid, 5-(2-(4-(4-(1-tetramantyl)phenoxy)phenyl)ethynyl)isophthalic acid, and 5-(2-(4-(4-(2-tetramantyl)phenoxy)phenyl)ethynyl)isophthalic acid; terephthalic acid having a tetramantyl structure and a phenylethynyl structure such as 5-(2-(4-(1-tetramantyl)phenyl)ethynyl)terephthalic acid, 5-(2-(4-(2-tetramantyl)phenyl)ethynyl)terephthalic acid, 5-(2-(4-(4-(1-tetramantyl)phenoxy)phenyl)ethynyl)terephthalic acid, and 5-(2-(4-(4-(2-tetramantyl)phenoxy)phenyl)ethynyl)terephthalic acid; phthalic acid having a biadamantyl structure and a phenylethynyl structure such as 3-(2-(4-(3-(1,1'-biadamantyl))phenyl)ethynyl)phthalic acid, 3-(2-(4-(2-(1,1'-biadamantyl))phenyl)ethynyl)phthalic acid, 4-(2-(4-(3-(1,1'-biadamantyl))phenyl)ethynyl)phthalic acid, 4-(2-(4-(2-(1,1'-biadamantyl))phenyl)ethynyl)phthalic acid, 3-(2-(4-(7-(1,1'-(3,5,3',5'-tetramethyl biadamantyl)))phenyl)ethynyl)phthalic acid, 3-(2-(4-(2-(1,1'-(3,5,3',5'-tetramethyl biadamantyl)))phenyl)ethynyl)phthalic acid, 4-(2-(4-(7-(1,1'-(3,5,3',5'-tetramethyl biadamantyl)))phenyl)ethynyl)phthalic acid, 4-(2-(4-(2-(1,1'-(3,5,3',5'-tetramethyl biadamantyl)))phenyl)ethynyl)phthalic acid, 3-(2-(4-(4-(3-(1,1'-biadamantyl))phenoxy)phenyl)ethynyl)phthalic acid, 3-(2-(4-(4-(2-(1,1'-biadamantyl))phenoxy)phenyl)ethynyl)phthalic acid, 4-(2-(4-(4-(3-(1,1'-biadamantyl))phenoxy)phenyl)ethynyl) phthalic acid, 4-(2-(4-(4-(2-(1,1'-biadamantyl))phenoxy)phenyl)ethynyl)phthalic acid, 3-(2-(4-(4-(7-(1,1'-(3,5,3',5'-tetramethyl biadamantyl)))phenoxy)phenyl)ethynyl)phthalic acid, 3-(2-(4-(4-(2-(1,1'-(3,5,3',5'-tetramethyl biadamantyl)))phenoxy)phenyl)ethynyl)phthalic acid, 4-(2-(4-(4-(7-(1,1'-(3,5,3',5'-tetramethyl biadamantyl)))phenoxy)phenyl)ethynyl)phthalic acid, and 4-(2-(4-(4-(2-(1,1'-(3,5,3',5'-tetramethyl biadamantyl)))phenoxy)phenyl)ethynyl)phthalic acid; isophthalic acid having a biadamantyl structure and a phenylethynyl structure such as 4-(2-(4-(3-(1,1'-biadamantyl))phenyl)ethynyl)isophthalic acid, 4-(2-(4-(2-(1,1'-biadamantyl))phenyl)ethynyl)isophthalic acid, 5-(2-(4-(3-(1,1'-biadamantyl))phenyl)ethynyl)isophthalic acid, 5-(2-(4-(2-(1,1'-biadamantyl))phenyl)ethynyl)isophthalic acid, 4-(2-(4-(7-(1,1'-(3,5,3',5'-tetramethyl biadamantyl)))phenyl)ethynyl)isophthalic acid, 4-(2-(4-(2-(1,1'-(3,5,3',5'-tetramethyl biadamantyl)))phenyl)ethynyl)isophthalic acid, 5-(2-(4-(7-(1,1'-(3,5,3',5'-tetramethyl biadamantyl)))phenyl)ethynyl)isophthalic acid, 5-(2-(4-(2-(1,1'-(3,5,3',5'-tetramethyl biadamantyl)))phenyl)ethynyl)isophthalic acid, 4-(2-(4-(4-(3-(1,1'-biadamantyl))phenoxy)phenyl)ethynyl)isophthalic acid, 4-(2-(4-(4-(2-(1,1'-biadamantyl))phenoxy)phenyl)ethynyl) isophthalic acid, 5-(2-(4-(4-(3-(1,1'-biadamantyl))phenoxy)phenyl)ethynyl)isophthalic acid, 5-(2-(4-(4-(2-(1,1'-biadamantyl))phenoxy)phenyl)ethynyl)isophthalic acid, 4-(2-(4-(4-(7-(1,1'-(3,5,3',5'-tetramethyl biadamantyl)))phenoxy)phenyl)ethynyl)isophthalic acid, 4-(2-(4-(4-(2-(1,1'-(3,5,3',5'-tetramethyl biadamantyl)))phenoxy)phenyl)ethynyl)isophthalic acid, 5-(2-(4-(4-(7-(1,1'-(3,5,3',5'-tetramethyl biadamantyl)))phenoxy)phenyl)ethynyl)isophthalic acid, and 5-(2-(4-(4-(2-(1,1'-(3,5,3',5'-tetramethyl biadamantyl)))phenoxy)phenyl)ethynyl)isophthalic acid; terephthalic acid having a biadamantyl structure and a phenylethynyl structure such as 5-(2-(4-(3-(1,1'-biadamantyl))phenyl)ethynyl)terephthalic acid, 5-(2-(4-(2-(1,1'-biadamantyl))phenyl)ethynyl)terephthalic acid, 5-(2-(4-(7-(1,1'-(3,5,3',5'-tetramethyl biadamantyl)))phenyl)ethynyl)terephthalic acid, 5-(2-(4-(2-(1,1'-(3,5,3',5'-tetramethyl biadamantyl)))phenyl)ethynyl)terephthalic acid, 5-(2-(4-(4-(3-(1,1'-biadamantyl))phenoxy)phenyl)ethynyl)terephthalic acid, 5-(2-(4-(4-(2-(1,1'-biadamantyl))phenoxy)phenyl)ethynyl)terephthalic acid, 5-(2-(4-(4-(7-(1,1'-(3,5,3',5'-tetramethyl biadamantyl)))phenoxy)phenyl)ethynyl)terephthalic acid, and 5-(2-(4-(4-(2-(1,1'-(3,5,3',5'-tetramethyl biadamantyl)))phenoxy)phenyl)ethynyl)terephthalic acid; and the like. An adamantane structure of a group having an alicyclic structure may be selected from the above-mentioned structures having an adamantane structure as a minimum unit. A binding position thereof may be optionally selected from the range specified by the general formula (1).

In the case of using a bis o-aminophenol compound containing a group having an alicyclic structure, the dicarboxylic acid compounds containing no group having an alicyclic structure can be used. The dicarboxylic acid compounds containing no group having an alicyclic structure includes 9,9-biscarboxyphenylfluorene, 9,9-bis[(4-carboxy-phenoxy)-phenyl]fluorene, 1,3-bis(4-carboxy-phenoxy)benzene, 2,2'-bis[(4-carboxy-phenoxy)-phenyl]biphenyl and the like.

In a combination of the bis o-aminophenol compound and dicarboxylic acid compound, each of those are preferred to have a group having an alicyclic structure to obtain a polybenzoxazole resin with lower dielectric constant and excellent heat resistance.

The dicarboxylic acid compound having an adamantane structure and a fluorene structure may be synthesized by the following method, for example. Firstly, 2-bromo-5-(1-adamantyl)-toluene or 1-bromo-3,5-dimethyladamantane, and 4-(1-adamantyl)-benzeneboronic acid undergo a Suzuki coupling reaction followed by a fluorenation reaction and a fluorenonation reaction to synthesize corresponding 2,7-diadamantylfluorenone or 2,7-di(3,5-dimethyl-1-adamantyl)fluorenone. The corresponding 2,7-diadamantylfluorenone or 2,7-di(3,5-dimethyl-1-adamantyl)fluorenone is subject to a dehydration reaction with methyl benzoate to obtain fluorene dimethyl dibenzoate having an adamantyl group. Alkaline hydrolysis and acid treatment are performed thereon, thus synthesizing 9,9-bis(4-carboxy-phenyl)-2,7-diadamantyl-fluorene. Also, fluorene bisphenol having an adamantyl group, which is an intermediate reactant of bisaminophenol compound synthesis, is etherified with 4-fluoro-benzoic acid methyl and then subject to alkaline hydrolysis and acid treatment, thus synthesized 9,9-bis[(4-carboxy-phenoxy)-phenyl]-2,7-diadamantyl-fluorene, 9,9-bis[(4-carboxy-phenoxy)-phenyl]-2,7-di(3,5-dimethyl-1-adamantyl)-fluorene.

The dicarboxylic acid compound having an adamantane structure and a benzene structure may be synthesized by the following method, for example. Firstly, dihydroxybenzene having an adamantane structure is synthesized by the reaction of resorcinol with 1-bromoadamantane or 1-bromo-3,5-dimethyladamantane. The dihydroxybenzene is etherified with methyl 4-fluorobenzoate. Alkaline hydrolysis and acid treatment are performed thereon, thus synthesizing 1,3-bis(4-carboxyl-phenoxy)-4,6-diadamantyl-benzene or 1,3-bis(4-carboxyl-phenoxy)-4,6-di(3,5-dimethyl-1-adamantyl)-benzene.

The dicarboxylic acid compound having an adamantane structure and a biphenyl structure may be synthesized by the following method, for example. Firstly, dihydroxy-biphenyl having an adamantyl group is synthesized by the reaction of 2,2'-dihydroxy-biphenyl with 1-bromo-adamantane or 1-bromo-3,5-dimethyladamantane. The dihydroxy-biphenyl is etherified with 4-fluoro-benzoic acid methyl and then subject to alkaline hydrolysis and acid treatment, thus synthesized 2,2'-bis(4-carboxy-phenoxy)-5,5'-diadamantyl-biphenyl, 2,2'-bis(4-carboxy-phenoxy)-5,5'-di(3,5-dimethyl-1-adamantyl)-biphenyl.

In these syntheses, a bis o-aminophenol compound and a dicarboxylic acid other than the above-mentioned bis o-aminophenol compound and dicarboxylic acid compound may be used for copolymerization or blending.

Also, the dicarboxylic acid compound other than the above-mentioned dicarboxylic acid compounds includes adamantanedicarboxylic acid, biadamantanedicarboxylic acid, tetraadamantanedicarboxylic acid and the like. Further, an alkyl group such as a methyl group, an ethyl group, a propyl group, and a butyl group; a fluoroalkyl group such as a fluoromethyl group, a fluoroethyl group, a fluoropropyl group, and a fluorobutyl group; and the like may be bonded to the said group having an adamantane structure. Solubility in a solvent and heat resistance can be further improved thereby.

A method of producing the polybenzoxazole resin precursor will be described further in detail.

A polybenzoxazole resin precursor having an adamantane structure can be obtained by the reaction of the bisaminophenol compound having an adamantane structure with the dicarboxylic acid compound having an adamantane structure. Examples of this reaction method include an acid chloride method and the like. Specifically, in the presence of a catalyst such as N,N'-dimethylformamide, the dicarboxylic acid and an excessive amount of thionyl chloride are reacted at room temperature to about 130° C. After distilling excess thionyl chloride by heating under reduced pressure, a residue is recrystallized with a solvent such as hexane to obtain dicarboxylic acid chloride.

Next, the dicarboxylic acid chloride obtained and the bisaminophenol compound are dissolved in a polar solvent such as N-methyl-2-pyrrolidone and N,N'-dimethylacetamide, and reacted between −30° C. to about room temperature in the presence of an acid acceptor such as pyridine, thus obtaining polybenzoxazole resin precursor having an adamantane structure. A number of repeating units is not specifically limited but preferably from 2 to 1,000 and more preferably from 5 to 100. If the number of repeating units is in the range, solubility and workability are particularly excellent.

Instead of the acid chloride method, the active ester method may be used. In the active ester method, for example, benzotriazyl ester is produced by reacting the dicarboxylic acid chloride and 1-hydroxybenzotriazole, and the ester compound is reacted with the bisaminophenol compound at room temperature or above as aforementioned.

Also, a terminal end of a resin precursor may be reacted with a monofunctional carboxylic acid compound or an o-aminophenol compound. Solubility in a solvent and heat resistance can be further improved thereby.

The monofunctional carboxylic acid compound includes benzoyl chloride, 4-adamantyl benzoic acid chloride and the like. The o-aminophenol compound includes 2-aminophenol, 4-adamantyl-2-aminophenol and the like.

In the present invention, a method for dehydrating and ring-closing the compound having a structure represented by the general formula (1) includes a heating method; an irradiation method using an active energy ray such as a microwave, visible light ray, UV-ray, X-ray, and an active radiation irradiation such as an electron beam; and so on. Hereinafter, methods for closing rings of the polyimide resin precursor and polybenzoxazole resin precursor will be described.

In the present invention, a polyimide resin is obtained by dehydrating and ring-closing said polyimide resin precursor. For example, there are methods such as carrying out a reaction at 150 to 300° C. for five minutes to twenty-four hours, irradiating with UV-ray, irradiating with an electron beam and so on.

In the present invention, a polybenzoxazole resin is obtained by dehydrating and ring-closing said polybenzoxazole resin precursor. For example, there are methods such as carrying out a reaction at 150 to 425° C. for five minutes to twenty-four hours, irradiating with UV-ray, irradiating with an electron beam and so on.

In a method for preparing the polyphenylene ether, for example, the polyphenylene ether can be obtained by the reaction of a bisphenol compound with an aromatic compound having a difluoro group under basic condition.

In a method for preparing the polyester, for example, the polyester can be obtained by the reaction of a bisphenol compound with a dicarboxylic acid compound by the acid chloride method or the active ester method.

The bisphenol compound includes, for example, a bisphenol compound having an adamantane structure and a fluorene structure such as 9,9-bis(4-hydroxy-phenyl)-2,7-diadamantyl-fluorene, 9,9-bis[(3-hydroxy-phenoxy)-phenyl]-2,7-diadamantyl fluorene and the like; a bisphenol compound having an adamantane structure and a benzene structure such as 1,3-bis(3-hydroxy-phenoxy)-4,6-diadamantyl-benzene and the like; a bisphenol compound having an adamantane structure and a naphthalene structure; a bisphenol compound having an adamantane structure and an anthracene structure; a bisphenol compound having an adamantane structure and a biphenyl structure such as 2,2'-dihydroxy-5,5'-diadamantyl-biphenyl, 2,2'-bis(3-hydroxy-phenoxy)-5,5'-diadamantyl-biphenyl; and the like. An adamantane structure may be selected from the above-mentioned structures having an adamantane structure as a minimum unit. A binding position thereof may be optionally selected from the range specified by the general formula (1).

The dicarboxylic acid compound may be selected from the dicarboxylic acids used for the polybenzoxazole resin precursor.

The aromatic compound having a difluoro group includes, for example, a difluoro compound having an adamantane structure and a fluorene structure such as 9,9-bis(4-fluoro-phenyl)-2,7-diadamantyl-fluorene, and 9,9-bis[(3-fluoro-phenoxy)-phenyl]-2,7-diadamantyl fluorene; a difluoro compound having an adamantane structure and a benzene structure such as 1,3-bis(3-fluoro-phenoxy)-4,6-diadamantyl-benzene; a difluoro compound having an adamantane structure and a naphthalene structure; a difluoro compound having an adamantane structure and an anthracene structure; a difluoro compound having an adamantane structure and biphenyl structure such as 2,2'-difluoro-5,5'-diadamantyl-biphenyl, and 2,2'-bis(3-fluoro-phenoxy)-5,5'-diadamantyl-biphenyl; and the like. An adamantane structure may be selected from the above-mentioned structures having an adamantane structure as a minimum unit. A binding position thereof may be optionally selected from the range specified by the general formula (1).

In the structure represented by the general formula (1), a functional group having an acetylene bond, a biphenylene group, a cyanate group, a maleimide group, a nadimide group, a vinyl group, a cyclopentadienyl group and the like may be bonded to a side chain, a chain end or a main chain. Also, a monomer having such a functional group may be copolymerized and a polymer having such a functional group may be blended. Thus, solubility in a solvent and heat resistance can be improved further.

As a monomer having a functional group having an acetylene bond among a monomer having such a functional group, a dicarboxylic acid compound having an acetylene bond includes 5-phenylethynyl isophthalic acid, 5-(4-phenylethynyl-phenoxy)-isophthalic acid, 5-ethynyl isophthalic acid, 5-(4-ethynyl-phenoxy)-isophthalic acid, 5-adamantylethynyl-isophthalic acid, 5-phenylethynyl-adamantane-1,3-dicarboxylic acid and the like; and a bisaminophenol compound having an acetylene bond includes 2,7-bisphenylethynyl-9,9-bis(4-hydroxy-3-amino-phenyl)-fluorene, 2,7-diethynyl-9,9-bis(4-hydroxy-3-amino-phenyl)-fluorene, 2,7-bisphenylethynyl-9,9-bis[4-(3-hydroxy-4-amino-phenoxy)-phenyl]-fluorene, 2,7-diethynyl-9,9-bis[4-(3-hydroxy-4-amino-phenoxy)-phenyl]-fluorene and the like.

In addition to said components, the resin composition of the present invention may comprise additives such as a surfactant, a coupling agent as typified by silane series, a radical initiator which generates an oxygen radical or a sulfur radical by heating, catalysts such as disulfides, and so on, if necessary.

Also, the resin composition may be used as a photosensitive resin composition by adding a naphthoquinonediazide compound or the like as a photosensitive agent. Specifically, in the case of introducing a hydroxyl group to the resin composition, or in the case that any of $R_1$ to $R_{10}$ of the general formula (1) is a hydroxyl group, that is, a polybenzoxazole resin precursor, the resin composition may be used as a positive-working photosensitive resin composition with a naphthoquinonediazide compound as a photosensitive agent. When containing a photo-crosslinking group like a methacryloyl group, the resin composition may be used as a negative-working photosensitive resin composition with a photo initiator.

The resin composition of the present invention can be obtained by compounding said components appropriately and blending those.

In the case of producing a resin film and so on, it is preferable that the resin composition of the present invention is used as a varnish by dissolving or dispersing in an organic solvent capable of dissolving or dispersing the resin composition. The organic solvent includes N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, methyl ethyl ketone, methyl isobutyl ketone, cyclopentanone, cyclohexanone, tetrahydrofuran, toluene, xylene, mesitylene and the like. Other organic solvents capable of dissolving or dispersing the resin composition of the present invention may be used. These organic solvents may be used alone or in combination of two or more.

The amount of the solvent to be used may be an amount capable of dissolving or dispersing the resin compositions completely and is not specifically limited. It may be varied for purposes. Generally, a solvent content in a varnish is preferably from 70 to 95 wt %.

Hereinafter, a resin film will be described.

A resin film of the present invention is obtained by using said resin composition. The resin film of the present invention is thus excellent in adhesion and dimensional stability.

The resin film, for example, may be used as an interlayer insulation film or a surface protection film for semiconductors, an interlayer insulation film of a multilayered circuit, a cover coat of flexible copper clad laminate, a solder resist film, a liquid crystal alignment layer, an etching protection film (etching stopper), an adhesive and so on. Among them, the resin film is suitably used for the interlayer insulation film or a surface protection film for semiconductors or the etching protection film.

By adding a naphthoquinonediazide compound or the like as a photosensitive agent to the resin composition, the resin film can be also used as a photosensitive surface protection film.

In the case of using the resin film as an interlayer insulation film, the resin composition is dissolved in an organic solvent such as N-methyl-2-pyrrolidone to prepare a varnish. The varnish obtained is applied onto an appropriate substrate such as a silicon wafer or a ceramic substrate to form a coating layer. A method for applying the varnish includes spin-coating by means of a spinner, spraying by means of a spray coater, dipping, printing, roll coating and so on. The coating layer is then subject to drying, heating so as to remove solvent, thus providing an interlayer insulation film. In the case of a polyimide resin precursor and polybenzoxazole resin precursor, after removal of solvent, the precursors are each subject to a condensation reaction and a crosslinking reaction by conventional methods to be a polyimide resin or polybenzoxazole resin, thus providing an interlayer insulation film composed of a resin composition comprising thereof. If a resin changed from the polyimide resin precursor or polybenzoxazole resin precursor is dissoluble in an organic solvent, after the polyimide resin precursor or polybenzoxazole resin precursor is preliminarily changed to a polyimide resin or polybenzoxazole resin, a varnish therefrom can be prepared. Then, an interlayer insulation film can be produced by the same method. At this time, since a process for changing a polyimide resin precursor or polybenzoxazole resin precursor to a resin is not necessary during heating treatment of a coating layer, heating time can be reduced.

The interlayer insulation film thickness is not specifically limited but preferably from 0.01 to 20 μm, more preferably from 0.05 to 10 μm and most preferably from 0.1 to 0.7 μm. In the case of such a thickness range, process compatibility is excellent.

In the case of using the resin film as a protection film for semiconductors, as in the case of using the resin film as an interlayer insulation film, the resin composition is dissolved in an organic solvent such as propylene oxide, diacetone alcohol, or N-methyl-2-pyrrolidone to prepare a varnish. The varnish obtained is applied onto an appropriate substrate such as silicon wafer or a ceramic substrate. A method for applying the varnish includes spin-coating by means of a spinner, spraying by means of a spray coater, dipping, printing, roll coating and so on. A coating of the varnish applied is then subject to drying, heating so as to remove solvent, thus providing a protection film. In the case of a polyimide resin precursor or polybenzoxazole resin precursor, after removal of solvent, the precursor is subject to a dehydration reaction to be a polyimide resin or polybenzoxazole resin, thus providing a protection film composed of a resin composition comprising thereof.

The protection film thickness is not specifically limited but preferably from 0.05 to 70 μm, more preferably from 0.1 to 50

μm. In the case of such a thickness range, both protection properties and workability of semiconductor elements are excellent.

Next, a semiconductor device will be explained, based on preferred embodiments.

FIG. 1 is a sectional view schematically showing an example of a semiconductor device of the present invention.

A semiconductor device 100 comprises a semiconductor substrate 1 provided with an element, a silicon nitride layer 2 provided on the semiconductor substrate 1 (upper side of FIG. 1), an interlayer insulation film 3 provided on the silicon nitride layer 2 and a copper wiring layer 4 covered with a barrier layer 6.

The interlayer insulation film 3 is provided with a concave corresponding to a wiring pattern, and the copper wiring layer 4 is provided therein.

A treated and modified layer 5 is provided between the interlayer insulation film 3 and the copper wiring layer 4.

A hard mask layer 7 is formed on the interlayer insulation film 3 (which is on a surface opposite to the silicon nitride layer 2).

In the embodiment of the present invention, the semiconductor device 100 by using the interlayer insulation film 3 was described; however, the present invention is not limited thereto.

By using the interlayer insulation film, a semiconductor device of the present invention is excellent in dimensional accuracy and provides sufficient insulation; thus, connection reliability is excellent.

Such interlayer insulation film is excellent in adhesion to a wiring layer; thus, connection reliability of a semiconductor device can be further improved.

Also, such interlayer insulation film has excellent dielectric properties; thus, signal loss of a semiconductor device can be reduced.

Also, the interlayer insulation film has excellent dielectric properties so as to reduce wiring delay.

EXAMPLES

Though the present invention will be hereinafter explained in detail by way of examples and comparative examples, the present invention is not restricted by these examples. The following methods are used to identify obtained compounds.

1. Mass spectrometry analysis (MS): measured by means of JMS-700 mass spectrometer (manufactured by: JEOL Ltd.) by the field desorption (FD) method.

2. Elemental analysis: Carbon, hydrogen and nitrogen was measured by means of model 2400 elemental analyzer (manufactured by: Perkin Elmer Co., Ltd.) and chlorine was measured by the flask combustion titration method.

Synthesis Example 1

Synthesis of 4,6-di(1-adamantyl)-1,3-bis(4-amino-3-hydroxyphenoxy)benzene 75.0 g of 1-bromoadamantane (349 mmol), 9.58 g of 1,3-dihydroxybenzene (87.0 mmol), 25 mL of toluene and stirrer were charged in a 300 mL recovery flask and heated and agitated at 130° C. for 24 hours under nitrogen flow. A solvent was removed under reduced pressure to obtain a solid. The obtained solid was purified by column chromatography, thus obtaining 23.0 g of 4,6-di(1-adamantyl)-1,3-dihydroxybenzene (60.8 mmol; the yield was 69.9%).

Next, 22.0 g of the 4,6-(1-adamantyl)-1,3-dihydroxybenzene obtained (58.1 mmol), 28.7 g of 2-benzyloxy-4-fluoronitrobenzene (116 mmol), 32.1 g of potassium carbonate (233 mmol), 180 mL of N,N-dimethylformamide and a stirrer were charged in a 300 mL recovery flask and heated and agitated at 135° C. for 12 hours under nitrogen flow. A reaction solution was filtered and then added to 1 L of ion-exchange water. Solid precipitate was collected by filtration, then agitated in 1 L of ion-exchange water for one hour and dried under reduced pressure, thus obtaining 40.5 g of 4,6-di(1-adamantyl)-1,3-bis(4-nitro-3-benzyloxyphenoxy)benzene (48.6 mmol; the yield was 83.6%).

Next, 39.0 g of the 4,6-di(1-adamantyl)-1,3-bis(4-nitro-3-benzyloxyphenoxy)benzene obtained (46.8 mmol), 1.49 g of 10% palladium-activated carbon (1.40 mmol), 273 mL of N,N-dimethylformamide and a stirrer were charged in a 300 mL recovery flask and agitated at 25° C. for 24 hours under a hydrogen atmosphere. A reaction solution was filtered and then added to 1 L of ion-exchange water. Solid precipitate was collected by filtration, then agitated in 1 L of ion-exchange water for another one hour and dried under reduced pressure, thus obtaining 24.0 g of 4,6-di(1-adamantyl)-1,3-bis(4-amino-3-hydroxyphenoxy)benzene (40.5 mmol; the yield was 86.5%).

Appearance and results of mass spectrometry analysis and elemental analysis are shown below. The data show that the obtained compound is a target product.

Appearance: a blown solid
MS (FD) (m/z): 593 (M$^+$)
Elemental analysis:
theoretical figures (/%): C, 77.00; H, 7.48; N, 4.73; O, 10.80.
actual measurement values (/%): C, 76.95; H, 7.50; N: 4.71; O, 10.81.

Synthesis Example 2

Synthesis of 4,6-di(3,5-dimethyl-1-adamantyl)-1,3-bis(4-amino-3-hydroxyphenoxy)benzene A synthesis was performed in the same condition as in the Synthesis example 1 except that 75.0 g of 1-bromoadamantane (349 mmol) was altered to 84.8 g of 1-bromo-3,5-dimethyladamantane (349 mmol).

Appearance and results of mass spectrometry analysis and elemental analysis are shown below. The data show that the obtained compound is a target product.

Appearance: a blown solid
MS (FD) (m/z): 648 (M$^+$)
Elemental analysis:
theoretical figures (/%): C, 77.74; H, 8.08; N, 4.32; O, 9.86.
actual measurement values (/%): C, 77.70; H, 8.03; N: 4.31; O, 9.88.

Synthesis Example 3

Synthesis of 4,6-di(3-(1-adamantyl)-1-adamantyl)-1,3-bis(4-amino-3-hydroxyphenoxy)benzene A synthesis was performed in the same condition as in the Synthesis example 1 except that 75.0 g of 1-bromoadamantane (349 mmol) was altered to 121.9 g of 3-bromo-1,1'-biadamantane (349 mmol).

Results of mass spectrometry analysis and elemental analysis are shown below. The data show that the obtained compound is a target product.

MS (FD) (m/z): 861 (M$^+$)

Elemental analysis:
theoretical figures (%): C, 80.89; H, 8.43; N, 3.25; O, 7.43.
actual measurement values (%): C, 80.83; H, 8.49; N: 3.32; O, 7.33.

Synthesis Example 4

Synthesis of 4,6-di(3-(3,5-dimethyl-1-adamantyl)-(3, 5-dimethyl-1-adamantyl))-1,3-bis(4-amino-3-hydroxyphenoxy)benzene A synthesis was performed in the same condition as in the Synthesis example 1 except that 75.0 g of 1-bromoadamantane (349 mmol) was altered to 141 g of 1-bromo-3,5-dimethyl-7-(3,5-dimethyl-1-adamantyl)adamantane (349 mmol).

Appearance and results of mass spectrometry analysis and elemental analysis are shown below. The data show that the obtained compound is a target product.
Appearance: a blown solid
MS (FD) (m/z): 973 (M$^+$)
Elemental analysis:
theoretical figures (/%): C, 81.44; H, 9.11; N, 2.88; O, 6.57.
actual measurement values (/%): C, 81.40; H, 9.10; N: 2.87; O, 6.56.

Synthesis Example 5

Synthesis of 9,9-bis(3-amino-4-hydroxy-phenyl)-2, 7-di(1-adamantyl)-fluorene (1) Synthesis of 4,4'-diadamantyl-2-methyl-1,1'-biphenyl In a 1 L three-neck flask provided with a Dimroth condenser and agitator, 3.19 g of magnesium (0.131 mol), 40 g of 5-adamantyl-2-bromotoluene (0.131 mol) and 200 mL of tetrahydrofuran were charged and refluxed under a nitrogen atmosphere for two hours to prepare Grignard reagent. Next, in another 1 L three-neck flask provided with a Dimroth condenser and agitator, 38.15 g of 1-adamantyl-4-bromobenzene (0.131 mol), 9.19 mg of bis(triphenylphosphine)palladium dichloride (0.0131 mmol) and 300 mL of THF were charged and nitrogen was passed into the flask. The above prepared THF solution as a Grignard reagent was charged therein and the mixture was refluxed for 12 hours. Next, 60 mL of 10% hydrochloric acid aqueous solution was added and the mixture was refluxed for 30 minutes. A reaction solution was cooled to room temperature. An organic layer was separated therefrom by means of a separating funnel and an aqueous layer was extracted with 50 mL of THF two times. Organic layers were combined and washed with 200 mL of saturated sodium hydrogen carbonate and then with 200 mL of water followed by drying with anhydrous sodium sulfate. A solvent was distilled by means of an evaporator, and then it was refined by alumina column chromatography (hexane/THF=1:1), thus obtaining 45.1 g of 4,4'-diadamantyl-2-methyl-1,1'-biphenyl (the yield was 79%).

(2) Synthesis of 2,7-diadamantylfluorenone 45.1 g of the 4,4'-diadamantyl-2-methyl-1,1'-biphenyl obtained (0.10 mol), 36.8 g of potassium dichromate (0.125 mol) and 200 mL of water were charged in 500 mL autoclave and heated at 250° C. for 48 hours. After cooling, the precipitate was filtered to separate. After three times of washing with 200 mL of ion-exchange water, the precipitate was filtered and separated again and agitated in sulfuric acid aqueous solution of pH 1 for two hours. The aqueous solution was subject to filtration to separate precipitate. The precipitate was washed with 200 mL of ion-exchange water three times and then with 100 ml of methanol, thus obtaining 42.2 g of 2,7-diadamantylfluorenone (the yield was 94%).

(3) Synthesis of 2,7-diadamantylfluorene-9,9-bisphenol

In a 500 mL four-neck flask provided with a thermometer, a Dimroth condenser and an agitator, 66.4 g of the 2,6-diadamantylfluorenone obtained (0.148 mol), 41.8 g of phenol (0.444 mol (three times moles)) and 203 mL of Eaton's reagent (7.7 wt % methanesulfonic acid solution of diphosphorus pentoxide) were charged and heated at 150° C. for 12 hours under a nitrogen atmosphere. After a reaction solution reached room temperature, 30 mL of ion-exchange water was added slowly. The reaction solution was charged in a separating funnel, then subject to three times of extraction with 20 mL of ethyl acetate and dried with magnesium sulfate. Ethyl acetate was removed therefrom by means of an evaporator and a crude product obtained was purified by column chromatography (hexane:ethyl acetate=4:1), thus obtaining 74.3 g of 2,7-diadamantylfluorene-9,9-bisphenol (0.12 mol, the yield was 81.1%).

Next, 200 mL of 20% nitric acid aqueous solution (0.64 mol) was charged in another 500 mL four-neck flask provided with a thermometer, an agitator and a reflux tube. 68.1 g of 2,7-diadamantylfluorene-9,9-bisphenol (0.11 mol) was added gradually with agitating hard with the inner temperature of the flask kept at 20 to 30° C. After the addition and no increase in temperature was observed, a reaction was continued for another one hour. Then, the mixture was charged in 500 mL of cool water and filtered to separate a crude product. The crude product was washed with pure water, dried and recrystallized with hot ethanol.

A recrystallized product obtained was dried under reduced pressure, thus obtaining 71.0 g of 9,9-bis(3-nitro-4-hydroxyphenyl)-2,7-di(1-adamantyl)-fluorene product (0.10 mol; the yield was 91.0%).

Next, in a 300 mL recovery flask, 71.0 g of the obtained 9,9-bis(3-nitro-4-hydroxyphenyl)-2,7-di(1-adamantyl)-fluorene (0.10 mol), 0.318 g of 10% palladium-activated carbon (0.30 mmol), 273 mL of N,N-dimethylformamide and a stirrer were charged and agitated at 25° C. for 24 hours under a hydrogen atmosphere. A reaction solution was filtered and then added to 1 L of ion-exchange water. Solid precipitate was collected by filtration, then agitated in 1 L of ion-exchange water for one hour and dried under reduced pressure, thus obtaining 61.0 g of 9,9-bis(3-amino-4-hydroxy-phenyl)-2,7-di(1-adamantyl)-fluorene (0.094 mol; the yield was 94.0%).

Appearance and results of mass spectrometry analysis and elemental analysis are shown below. The data show that the obtained compound is a target product.
Appearance: a blown solid
MS (FD) (m/z): 649 (M$^+$)
Elemental analysis:
theoretical figures (/%): C, 83.30; H, 7.46; N, 4.32; O, 4.93.
actual measurement values (/%): C, 83.36; H, 7.35; N: 4.36; O, 4.91.

Synthesis Example 6

Synthesis of 9,9-bis(3-amino-4-hydroxy-phenyl)-2, 7-di(3,5-dimethyl-1-adamantyl)-fluorene A synthesis was performed in the same condition as in the Synthesis example 5 except that 38.15 g of 1-adamantyl-4- bromobenzene (131 mmol) was altered to 41.7 g of 3,5-dimethyl-1-adamantyl-4-bromobenzene (131 mmol).

Appearance and results of mass spectrometry analysis and elemental analysis are shown below. The data show that the obtained compound is a target product.

Appearance: a blown solid
MS (FD) (m/z): 704 ($M^+$)
Elemental analysis:
theoretical figures (/%): C, 83.48; H, 8.01; N, 3.97; O, 4.54.
actual measurement values (/%): C, 83.49; H, 8.00; N: 3.98; O, 4.52.

Synthesis Example 7

Synthesis of 9,9-bis[4-(3-hydroxy-4-amino-phenoxy)-phenyl]-2,7-di(1-adamantyl)-fluorene 36.0 g of 2,7-diadamantylfluorene-9,9-bisphenol (58.1 mmol) obtained in Synthesis example 5, 28.7 g of 2-benzyloxy-4-fluoronitrobenzene (116 mmol), 32.1 g of potassium carbonate (233 mmol), 180 mL of N,N-dimethylformamide and a stirrer were charged in a 300 mL recovery flask and heated and agitated at 135° C. for 12 hours under nitrogen flow. A reaction solution was filtered and then added to 1 L of ion-exchange water. Solid precipitate was collected by filtration, then agitated in 1 L of ion-exchange water for one hour and dried under reduced pressure, thus obtaining 52.5 g of 9,9-bis[4-(4-nitro-3-benzyloxyphenoxy)-phenyl]-2,7-di(1-adamantyl)-fluorene (48.9 mmol; the yield was 84.2%).

Next, 50.2 g of the obtained 9,9-bis[4-(4-nitro-3-benzyloxyphenoxy)-phenyl]-2,7-di(1-adamantyl)-fluorene (46.8 mmol), 1.49 g of 10% palladium-activated carbon (1.40 mmol), 273 mL of N,N-dimethylformamide and a stirrer were charged in a 300 mL recovery flask and agitated at 25° C. for 24 hours under a hydrogen atmosphere. A reaction solution was filtered and then added to in 1 L of ion-exchange water. Solid precipitate was collected by filtration, then agitated in 1 L of ion-exchange water for another one hour and dried under reduced pressure, thus obtaining 34.6 g of 9,9-bis[4-(3-hydroxy-4-amino-phenoxy)-phenyl]-2,7-di(1-adamantyl)-fluorene (41.5 mmol; the yield was 88.7%).

Appearance and results of mass spectrometry analysis and elemental analysis are shown below. The data show that the obtained compound is a target product.

Appearance: a blown solid
MS (FD) (m/z): 1,041 ($M^+$)
Elemental analysis:
theoretical figures (/%): C, 84.20; H, 6.97; N, 2.69; O, 6.15.
actual measurement values (/%): C, 84.17; H, 6.95; N: 2.70; O, 6.13.

Synthesis Example 8

Synthesis of 2,2'-dihydroxy-3,3'-diamino-5,5'-bis[3-(1-adamantyl)-(1-adamantyl)]-biphenyl 1,210.9 g of 3-bromo-1,1'-biadamantane (3.9 mol), 162.0 g of 2,2'-dihydroxy-biphenyl (870.0 mmol), 250 mL of toluene and a stirrer were charged in a 3 L recovery flask. The mixture was heated and agitated at 130° C. for 24 hours under nitrogen flow. A solid was obtained by removing a solvent under reduced pressure. The obtained solid was purified by column chromatography, thus obtained 428.1 g of 2,2'-dihydroxy-5,5'-bis[3-(1-adamantyl)-(1-adamantyl)]-biphenyl (592.0 mmol; the yield was 68.0%).

Next, 200 mL of 20% nitric acid aqueous solution (0.64 mol) was charged in a 500 mL four-neck flask provided with a thermometer, an agitator and a reflux tube. 216.9 g of 2,2'-dihydroxy-5,5'-bis[3-(1-adamantyl)-(1-adamantyl)]-biphenyl (0.30 mol) was added gradually with agitating hard with the inner temperature of the flask kept at 20 to 30° C. After the addition and no increase in temperature was observed, a reaction was continued for another one hour. Then, the mixture was charged in 500 mL of cool water and filtered to separate a crude product. The crude product was washed with pure water, dried and recrystallized with hot ethanol.

A recrystallized product obtained was dried under reduced pressure, thus obtaining 207.3 g of 2,2'-dihydroxy-3,3'-dinitro-5,5'-bis[3-(1-adamantyl)-(1-adamantyl)]-biphenyl (0.255 mol; the yield was 85.0%).

Next, in a 300 mL recovery flask, the obtained 81.3 g of 2,2'-dihydroxy-3,3'-dinitro-5,5'-bis[3-(1-adamantyl)-(1-adamantyl)]-biphenyl (0.10 mol), 0.318 g of 10% palladium-activated carbon (0.30 mmol), 273 mL of N,N-dimethylformamide and a stirrer were charged and agitated at 25° C. for 24 hours under a hydrogen atmosphere. A reaction solution was filtered and then added to 1 L of ion-exchange water. Solid precipitate was collected by filtration, then agitated in 1 L of ion-exchange water for one hour and dried under reduced pressure, thus obtaining 69.3 g of 2,2'-dihydroxy-3,3'-diamino-5,5'-bis[3-(1-adamantyl)-(1-adamantyl)]-biphenyl (0.092 mol; the yield was 92.0%).

Appearance and results of mass spectrometry analysis and elemental analysis are shown below. The data show that the obtained compound is a target product.

Appearance: a blown solid
MS (FD) (m/z): 753 ($M^+$)
Elemental analysis:
theoretical figures (/%): C, 82.93; H, 9.10; N, 3.72; O, 4.25.
actual measurement values (/%): C, 82.92; H, 9.15; N: 3.66; O, 4.27.

Synthesis Example 9

Synthesis of 2,2'-dihydroxy-3,3'-diamino-5,5'-bis(3,5-dimethyl-1-adamantyl)-biphenyl A synthesis was performed in the same condition as in Synthesis example 8 except that 1,210.9 g of 3-bromo-1,1'-biadamantane (3.9 mol) was altered to 141 g of 1-bromo-3,5-dimethyladamantane (349 mmol).

Appearance and results of mass spectrometry analysis and elemental analysis are shown below. The data show that the obtained compound is a target product.

Appearance: a blown solid
MS (FD) (m/z): 540 ($M^+$)
Elemental analysis:
theoretical figures (/%): C, 79.96; H, 8.95; N, 5.18; O, 5.92.
actual measurement values (/%): C, 79.98; H, 8.94; N: 5.17; O, 5.93.

Synthesis Example 10

Synthesis of 2,2'-dihydroxy-3,3'-diamino-5,5'-bis(3-(5,7-dimethyl-1-adamantyl)-(3,5-dimethyl-1-adamantyl))biphenyl A synthesis was performed in the same condition as in the Synthesis example 8 except that 1,210.9 g of 3-bromo-1,1'-biadamantane (3.9 mol) was altered to 141 g 3-bromo-5,5'-7,7'-tetramethyl-1,1'-biadamantane (349 mmol).

Appearance and results of mass spectrometry analysis and elemental analysis are shown below. The data show that the obtained compound is a target product.

Appearance: a blown solid
MS (FD) (m/z): 865 (M$^+$)
Elemental analysis:
theoretical figures (/%): C, 83.28; H, 9.78; N, 3.24; O, 3.70.
actual measurement values (/%): C, 83.26; H, 9.78; N: 3.25; O, 3.71.

Synthesis Example 11

Synthesis of 2,2'-bis[4-(3-hydroxy-4-amino)phenoxy]-5,5'-bis[(3-(1-adamantyl)-(1-adamantyl))-biphenyl 42.0 g of 2,2'-dihydroxy-5,5'-bis[3-(1-adamantyl)-(1-adamantyl)]-biphenyl (58.1 mmol) obtained in Synthesis example 8, 28.7 g of 2-benzyloxy-4-fluoronitrobenzene (116 mmol), 32.1 g of potassium carbonate (233 mmol), 180 mL of N,N-dimethylformamide and a stirrer were charged in a 300 mL recovery flask and heated and agitated at 135° C. for 12 hours under nitrogen flow. A reaction solution was filtered and then added to 1 L of ion-exchange water. Solid precipitate was collected by filtration, then agitated in 1 L of ion-exchange water for one hour and dried under reduced pressure, thus obtaining 57.9 g of 2,2'-bis[4-(3-benzyloxy-4-nitro-phenoxy)-phenyl]-5,5'-bis[3-(1-adamantyl)-(1-adamantyl)]-biphenyl (49.2 mmol; the yield was 84.8%).

Next, 55.1 g of the obtained 2,2'-bis[4-(3-benzyloxy-4-nitro-phenoxy)-phenyl]-5,5'-bis[3-(1-adamantyl)-(1-adamantyl)]-biphenyl (46.8 mmol), 1.49 g of 10% palladium-activated carbon (1.40 mmol), 273 mL of N,N-dimethylformamide and a stirrer were charged in a 300 mL recovery flask and agitated at 25° C. for 24 hours under a hydrogen atmosphere. A reaction solution was filtered and then added to in 1 L of ion-exchange water. Solid precipitate was collected by filtration, then agitated in 1 L of ion-exchange water for another one hour and dried under reduced pressure, thus obtaining 39.0 g of 2,2'-bis[4-(3-hydroxy-4-amino-phenoxy)]-5,5'-bis[3-(1-adamantyl)-(1-adamantyl)]-biphenyl (41.6 mmol; the yield was 88.8%).

Appearance and results of mass spectrometry analysis and elemental analysis are shown below. The data show that the obtained compound is a target product.

Appearance: a blown solid
MS (FD) (m/z): 937 (M$^+$)
Elemental analysis:
theoretical figures (/%): C, 82.01; H, 8.17; N, 2.99; O, 6.83.
actual measurement values (/%): C, 82.00; H, 8.12; N: 3.02; O, 6.86.

Synthesis Example 12

Synthesis of 2,2'-bis[4-(3-hydroxy-4-amino)phenoxy]-5,5'-bis(3-(3,5-dimethyl-1-adamantyl)biphenyl A synthesis was performed in the same condition as in the Synthesis example 11 except that 42.0 g of 2,2'-dihydroxy-5,5'-bis[3-(1-adamantyl)-(1-adamantyl)]-biphenyl (58.1 mmol) was altered to 29.6 g of 2,2'-dihydroxy-5,5'-bis(3,5-dimethyl-1-adamantyl)-biphenyl (58.1 mmol), which was obtained as in Synthesis example 8 except for using 141 g of 1-bromo-3,5-dimethyladamantane (349 mmol) instead of 1,210.9 g of 3-bromo-1,1'-biadamantane (3.9 mol).

Appearance and results of mass spectrometry analysis and elemental analysis are shown below. The data show that the obtained compound is a target product.

Appearance: a blown solid
MS (FD) (m/z): 724 (M$^+$)
Elemental analysis:
theoretical figures (/%): C, 79.52; H, 7.79; N, 3.86; O, 8.83.
actual measurement values (/%): C, 79.50; H, 7.80; N: 3.84; O, 8.81.

Synthesis Example 13

Synthesis of 4,6-di(1-adamantyl)-1,3-bis(4-carboxyphenoxy)benzene dichloride

In a 500 mL four-neck flask provided with a thermometer, a Dimroth condenser and an agitator, 46.2 g of 4,6-di(1-adamantyl)-1,3-dihydroxybenzene (0.122 mol) obtained in Synthesis example 1, 38.8 g of methyl 4-fluorobenzoate (0.252 mol) and 300 mL of N,N-dimethylformamide were charged. 42.1 g of potassium carbonate (0.304 mol) was further added. After agitating at 135° C. for 12 hours, a reaction solution was filtered and filtrate was added dropwise to 2 L of ion-exchange water. A solid precipitate was subject to two times of washing with 2 L of methanol followed by drying under reduced pressure at 50° C. for two days, thus obtaining 64.6 g of 4,6-di(1-adamantyl)-1,3-bis(4-carboxymethyl-phenoxy)benzene (0.105 mol; the yield was 86.1%).

Synthesis of 4,6-di(1-adamantyl)-1,3-bis(4-carboxyphenoxy)benzene dipotassium salt In a 2 L four-neck flask provided with a thermometer, a Dimroth condenser and an agitator, 1 L of n-butanol and 65.9 g of potassium hydroxide (85%) (1.0 mol) were charged. The mixture was then heated and refluxed to be dissolved. After addition of 61.5 g of 4,6-di(1-adamantyl)-1,3-bis(4-carboxymethyl-phenoxy)benzene (0.10 mol) which was obtained by repeating the above process, the mixture was heated and refluxed for 30 minutes. Next, it was cooled in an ice bath and filtered to obtain crystal thus separated. The crystal was subject to two times of washing with 1 L of ethanol followed by drying under reduced pressure at 60° C., thus obtaining 66.0 g of 4,6-di(1-adamantyl)-1,3-bis(4-carboxy-phenoxy)benzene dipotassium salt (0.095 mol; the yield was 95.0%).

In a 2 L four-neck flask provided with a thermometer, a Dimroth condenser and an agitator, the obtained 62.5 g of 4,6-di(1-adamantyl)-1,3-bis(4-carboxy-phenoxy)benzene dipotassium salt (0.09 mol) and 200 mL of 1,2-dichloroethane were charged and cooled to 0° C. 178.5 g of thionyl chloride (1.5 mol) was added dropwise at 5° C. or below for one hour. Then, 1.5 mL of dimethylformamide and 1.5 g of hydroquinone were added therein and the mixture was agitated at 45 to 50° C. for three hours. After cooling, crystal was removed therefrom by filtration and washed with 50 mL of chloroform. Filtrate and washing solution was condensed together under reduced pressure at 40° C. or less, and a residue obtained was subject to two times of extraction and filtration with 200 mL of diethyl ether. Diethyl ether was removed from an extract under reduced pressure to obtain a semisolid crude product. The semisolid crude product was washed with dried n-hexane and recrystallized with diethyl ether, thus obtaining 38.9 g of 4,6-di(1-adamantyl)-1,3-bis(4-carboxy-phenoxy)benzene dichloride (0.0594 mol; the yield was 66.0%).

Appearance and results of mass spectrometry analysis and elemental analysis are shown below. The data show that the obtained compound is a target product.

Appearance: a light yellow solid
MS (FD) (m/z): 656 (M$^+$)
Elemental analysis:
theoretical figures (/%): C, 73.28; H, 6.15; Cl: 10.81; O, 9.76.
actual measurement values (/%): C, 73.25; H, 6.21; Cl, 10.75; O, 9.79.

Synthesis Example 14

Synthesis of 4,6-di(3,5-dimethyl-1-adamantyl)-1,3-bis(4-carboxy-phenoxy)benzene dichloride A synthesis was performed in the same condition as in the Synthesis example 13 except that 46.2 g of 4,6-di(1-adamantyl)-1,3-dihydroxybenzene (0.122 mol) was altered to 53.0 g of 4,6-di(3,5-dimethyl-1-adamantyl)1,3-dihydroxybenzene (0.122 mol).

Appearance and results of mass spectrometry analysis and elemental analysis are shown below. The data show that the obtained compound is a target product.

Appearance: a blown solid
MS (FD) (m/z): 711 (M$^+$)
Elemental analysis:
theoretical figures (/%): C, 74.25; H, 6.80; Cl: 9.96; O, 8.99.
actual measurement values (/%): C, 74.23; H, 6.81; Cl, 9.98; O, 8.96.

Synthesis Example 15

Synthesis of 4,6-di[(3-(1-adamantyl)-(1-adamantyl)]-1,3-bis(4-carboxy-phenoxy)benzene dichloride 121.9 g of 3-bromo-1,1'-biadamantane (349 mmol), 9.58 g of 1,3-dihydroxybenzene (87.0 mmol), 25 mL of toluene and a stirrer were charged in a 300 mL recovery flask. The mixture was heated and agitated at 130° C. for 24 hours under nitrogen flow. A solid was obtained by removing a solvent under reduced pressure. The obtained solid was purified by column chromatography, thus obtaining 37.4 g of 4,6-di[3-(1-adamantyl)-(1-adamantyl)]-1,3-dihydroxybenzene (57.8 mmol; the yield was 66.4%).

Next, a synthesis was performed in the same condition as in Synthesis example 13 except that 46.2 g of 4,6-di(1-adamantyl)-1,3-dihydroxybenzene (0.122 mol) was altered to 78.9 g of the obtained 4,6-di[3-(1-adamantyl)-(1-adamantyl)]-1,3-dihydroxybenzene (0.122 mol), thus obtaining 4,6-di[(3-(1-adamantyl)-(1-adamantyl))-1,3-bis(4-carboxy-phenoxy)benzene dichloride.

Appearance and results of mass spectrometry analysis and elemental analysis are shown below. The data show that the obtained compound is a target product.

Appearance: a light yellow solid
MS (FD) (m/z): 924 (M$^+$)
Elemental analysis:
theoretical figures (/%): C, 77.98; H, 7.42; Cl: 7.67; O, 6.93.
actual measurement values (/%): C, 78.02; H, 7.46; Cl, 7.62; O, 6.90.

Synthesis Example 16

Synthesis of 4,6-di[(3-(5,7-dimethyl-1-adamantyl)-(3,5-dimethyl-1-adamantyl))-1,3-bis(4-carboxy-phenoxy)benzene dichloride A synthesis was performed in the same condition as in Synthesis example 13 except that 46.2 g of 4,6-di(1-adamantyl)-1,3-dihydroxybenzene (0.122 mol) was altered to 92.6 g of 4,6-di[(3-(5,7-dimethyl-1-adamantyl)-(3,5-dimethyl-1-adamantyl))-1,3-dihydroxybenzene (0.122 mol).

Appearance and results of mass spectrometry analysis and elemental analysis are shown below. The data show that the obtained compound is a target product.

Appearance: a blown solid
MS (FD) (m/z): 1,036 (M$^+$)
Elemental analysis:
theoretical figures (/%): C, 78.81; H, 8.17; Cl: 6.84; O, 6.18.
actual measurement values (/%): C, 78.79; H, 8.20; Cl, 6.82; O, 6.19.

Synthesis Example 17

Synthesis of 2,7-diadamantylfluorene-9,9-bisbenzoic acid dichloride

In a 500 mL four-neck flask provided with a thermometer, a Dimroth condenser and an agitator, 44.9 g of 2,7-diadamantylfluorenone (100 mmol) obtained in Synthesis example 5, 36.6 g of benzoic acid (300 mmol), 203 mL of Eaton's reagent (7.7 wt % methanesulfonic acid solution of diphosphorus pentoxide) were charged and heated at 150° C. for 12 hours under a nitrogen atmosphere. After the reaction solution reached room temperature, 100 mL of ion-exchange water was added slowly. The reaction solution was charged in a separating funnel, then extracted three times with 100 mL of ethyl acetate and dried with magnesium sulfate. Ethyl acetate was removed therefrom by means of an evaporator. The obtained crude product was purified by column chromatography (hexane:ethyl acetate=4:1), thus obtaining 54.7 g of 2,7-diadamantylfluorene-9,9-bisbenzoic acid (81 mmol; the yield was 81%).

In a 2 L four-neck flask provided with a thermometer, a Dimroth condenser and an agitator, 54.7 g of 2,7-diadamantylfluorene-9,9-bisbenzoic acid (81 mmol) obtained by the above method and 200 mL of 1,2-dichloroethane were charged and cooled to 0° C. 178.5 g of thionyl chloride (1.5 mol) was added dropwise at 5° C. or less for one hour. Then, 1.5 mL of dimethylformamide and 1.5 g of hydroquinone were added therein and the mixture was agitated at 45 to 50° C. for three hours. After cooling, filtration was performed thereon to remove crystal. The crystal was washed with 50 mL of chloroform. Filtrate and washing solution was condensed under reduced pressure at 40° C. or less, and a residue obtained was subject to two times of extraction and filtration with 200 mL of diethyl ether. A semisolid crude product was obtained by removing diethyl ether from an extract under reduced pressure. The semisolid crude product was washed with dried n-hexane and recrystallized with diethyl ether, thus obtaining 39.4 g of 2,7-di(1-adamantyl)fluorene-9,9-bisbenzoic acid dichloride (55.4 mmol; the yield was 68.4%).

Appearance and results of mass spectrometry analysis and elemental analysis are shown below. The data show that the obtained compound is a target product.

Appearance: a light yellow solid
MS (FD) (m/z): 712 ($M^+$)
Elemental analysis:
theoretical figures (/%): C, 79.31; H, 6.23; Cl: 9.96; O, 4.50.
actual measurement values (/%): C, 79.34; H, 6.26; Cl, 9.87; O, 4.53.

Synthesis Example 18

Synthesis of 2,7-di(3,5-dimethyl-1-adamantyl)fluorine-9,9-bisbenzoic acid dichloride A synthesis was performed in the same condition as in the Synthesis example 17 except that 44.9 g of 2,7-diadamantylfluorenone (100 mmol) was altered to 50.4 g of 2,7-di(3,5-dimethyl-1-adamantyl)fluorenone (100 mmol).

Appearance and results of mass spectrometry analysis and elemental analysis are shown below. The data show that the obtained compound is a target product.

Appearance: a blown solid
MS (FD) (m/z): 767 ($M^+$)
Elemental analysis:
theoretical figures (/%): C, 79.77; H, 6.83; Cl: 9.23; O, 4.17.
actual measurement values (/%): C, 79.75; H, 6.80; Cl, 9.21; O, 4.16.

Synthesis Example 19

Synthesis of 9,9-bis[4-(4-carboxy-phenoxy)-phenyl]-2,7-di(1-adamantyl)-fluorene dichloride A synthesis was performed in the same condition as in the Synthesis example 13 except that 46.2 g of 4,6-di(1-adamantyl)-1,3-dihydroxybenzene (0.122 mol) was altered to 75.5 g of 2,7-di(1-adamantyl)fluorene-9,9-bisphenol obtained in Synthesis example 5.

Appearance and results of mass spectrometry analysis and elemental analysis are shown below. The data show that the obtained compound is a target product.

Appearance: a light yellow solid
MS (FD) (m/z): 896 ($M^+$)
Elemental analysis:
theoretical figures (/%): C, 79.09; H, 5.85; Cl: 7.91; O, 7.14.
actual measurement values (/%): C, 79.14; H, 5.89; Cl, 7.87; O, 7.10.

Synthesis Example 20

Synthesis of 9,9-bis[4-(4-carboxy-phenoxy)-phenyl]-2,7-di(3,5-dimethyl-1-adamantyl)-fluorene dichloride A synthesis was performed in the same condition as in the Synthesis example 13 except that 46.2 g of 4,6-di(1-adamantyl)-1,3-dihydroxybenzene (0.122 mol) was altered to 82 g of 2,7-di(3,5-dimethyl-1-adamantyl)fluorine-9,9-bisphenol (0.122 mol).

Appearance and results of mass spectrometry analysis and elemental analysis are shown below. The data show that the obtained compound is a target product.

Appearance: a light yellow solid
MS (FD) (m/z): 952 ($M^+$)
Elemental analysis:
theoretical figures (/%): C, 79.48; H, 6.35; Cl: 7.45; O, 6.72.
actual measurement values (/%): C, 79.46; H, 6.32; Cl, 7.42; O, 6.73.

Synthesis Example 21

Synthesis of 2,2'-bis[(4-carboxy-phenoxy)-phenyl]-5,5'-bis[3-(1-adamantyl)-(1-adamantyl)]-biphenyl dichloride A synthesis was performed in the same condition as in the Synthesis example 13 except that 46.2 g of 4,6-di(1-adamantyl)-1,3-dihydroxybenzene (0.122 mol) was altered to 88.2 g of 2,2'-dihydroxy-5,5'-bis[3-(1-adamantyl)-(1-adamantyl)]-biphenyl (0.122 mol) obtained in Synthesis example 8.

Appearance and results of mass spectrometry analysis and elemental analysis are shown below. The data show that the obtained compound is a target product.

Appearance: a light yellow solid
MS (FD) (m/z): 1,000 ($M^+$)
Elemental analysis:
theoretical figures (/%): C, 79.26; H, 7.26; Cl: 7.09; O, 6.40.
actual measurement values (/%): C, 79.23; H, 7.29; Cl, 7.12; O, 6.36.

Synthesis Example 22

Synthesis of 5-(2-(1-adamantyl)ethynyl)isophthalic acid dichloride from 5-(2-(1-adamantyl)ethynyl) isophthalic acid dipotassium salt (1) Synthesis of 1-ethynyl adamantane 1-ethynyladamantane was synthesized from 1-bromoadamantane according to the method mentioned in a document (Y. Okano, T. Masuda and T. Higashimura, "Journal of Polymer Science: Polymer Chemistry Edition", Vol. 23, 1985, pp. 2527-2537).

(2) Synthesis of 1-(3,5-bis(methoxycarbonyl)phenyl)-2-(1-adamantyl)ethyne from dimethyl 5-bromoisophthalate In a 1 L four-neck flask provided with a thermometer, a Dimroth condenser, a nitrogen inlet pipe and an agitator, 125 g of dimethyl 5-bromoisophthalate (0.458 mol), 1.1 g of triphenyl phosphine (0.00419 mol), 0.275 g of copper iodide (0.00144 mol) and 64.26 g of the obtained 1-ethynyladamantane (0.401 mol) were charged and nitrogen was passed into the flask. Then, 375 mL of dehydrated triethylamine and 200 mL of dehydrated pyridine were added therein and the mixture was agitated and dissolved. After nitrogen was passed into the flask for one hour, 0.3 g of dichlorobis (triphenyl phosphine) palladium (0.000427 mol) was quickly added and the mixture was heated and refluxed in an oil bath. Then, triethylamine and pyridine was removed under reduced pressure to obtain a brown viscous solution. The solution was added to 500 mL of water and filtered to separate a solid. The solid was washed with 500 mL of water, 500 mL of 5 mol/L hydrochloric acid and 500 mL of water each two times and dried under pressure at 50° C., thus obtaining 121.5 g of 1-(3,5-bis(methoxycarbonyl)phenyl)-2-(1-adamantyl) ethyne (the yield was 86%).

(3) Synthesis of 5-(2-(1-adamantyl)ethynyl) isophthalic acid dipotassium salt from 1-(3,5-bis(methoxycarbonyl)phenyl)-2-(1-adamantyl)ethyne In a 5 L four-neck flask provided with a thermometer, a Dimroth condenser and an agitator, 3 L of n-butanol and 226 g of potassium hydroxide (85%) (2.72 mol) were charged. The mixture was heated and refluxed to be dissolved. After adding 120 g of the obtained 1-(3,5-bis(methoxycarbonyl) phenyl)-2-(1-adamantyl)ethyne (0.341 mol) therein, the mixture was heated and refluxed for 30 minutes. Next, it was cooled in an ice bath and filtered to obtain precipitated crystal. The crystal was washed with 1 L of ethanol two times followed by drying under pressure at 60° C., thus obtaining 132.49 g of 5-(2-(1-adamantyl)ethynyl) isophthalic acid dipotassium salt (the yield was 97%).

(4) Synthesis of 5-(2-(1-adamantyl)ethynyl)isophthalic acid from 5-(2-(1-adamantyl)ethynyl) isophthalic acid dipotassium salt 7.6 g of 5-(2-(1-adamantyl)ethynyl) isophthalic acid dipotassium salt (0.019 mol) obtained above was dissolved in 20 mL of ion-exchange water and filtered with a 5 C filter paper to remove insoluble matter. 5 mol/L hydrochloric acid was added to this filtrate to be pH 1 with agitating. A precipitated solid was obtained by filtration and it was subject to two times of washing with ion-exchange water and filtration. The obtained solid was dried under pressure at 50° C., thus obtaining 6.1 g of 5-(2-(1-adamantyl)ethynyl)isophthalic acid (the yield was 99.5%).
Appearance: white powder
IR:
carboxylic acid: 1,710-1,680 cm$^{-1}$; and ethynyl group: 2,260-2,190 cm$^{-1}$
Elemental analysis:
theoretical figures (/%): C, 74.06%; H, 6.21%; O, 19.73%.
actual measurement values (/%): C, 74.12%; H, 6.14%; O, 19.74%.

(5) Synthesis of 5-(2-(1-adamantyl)ethynyl)isophthalic acid dichloride from [5-(2-(1-adamantyl)ethynyl) isophthalic acid dipotassium salt In a 2 L four-neck flask provided with a thermometer, a Dimroth condenser and an agitator, 96.1 g of 5-(2-(1-adamantyl)ethynyl) isophthalic acid dipotassium salt (0.24 mol) obtained above and 400 mL of 1,2-dichloroethane were charged and cooled to 0° C. 391 g of thionyl chloride (4.5 mol) was added dropwise at 5° C. or below for one hour. Then, 4 mL of dimethylformamide and 4 g of hydroquinone were added therein and agitated at 45 to 50° C. for three hours. After cooling, crystal generated while cooling was removed by filtration and washed with 150 mL of chloroform. Filtrate and washing solution was condensed together under reduced pressure at 40° C. or less, and the obtained residue was subject to two times of extraction and filtration with 200 mL of diethyl ether. Diethyl ether was removed from an extract under reduced pressure to obtain a semisolid crude product.

The semisolid crude product was washed with dried n-hexane and recrystallized with diethyl ether, thus obtaining 16.5 g of 5-(2-(1-adamantyl)ethynyl)isophthalic acid dichloride (the yield was 19%).
Appearance: white powder
IR:
carboxylic acid chloride: 1,800-1,770 cm$^{-1}$; and ethynyl group: 2,260-2,190 cm$^{-1}$
MS (FD) (m/z): 290 (M$^+$-2Cl)
Elemental analysis:
theoretical figures (/%): C, 66.49%; H, 5.02%; Cl: 19.63; O, 8.86%.
actual measurement values (/%): C, 66.41%; H, 5.08%; Cl, 19.70; O, 8.81%.

Synthesis Example 23

Synthesis of 4,6-di(1-adamantyl)-1,3-bis(4-aminophenoxy)benzene

In a 300 mL recovery flask, 22.0 g of 4,6-(1-adamantyl)-1,3-dihydroxybenzene obtained in Synthesis example 1 (58.1 mmol), 17.2 g of 4-fluoronitrobenzene (122 mmol), 32.1 g of potassium carbonate (233 mmol), 180 mL of N,N-dimethylformamide and a stirrer were charged. The mixture was heated and agitated at 135° C. for 12 hours under nitrogen flow. A reaction solution was filtered and then added to 1 L of ion-exchange water. Solid precipitate was collected by filtration, then agitated in 1 L of ion-exchange water for one hour and dried under reduced pressure, thus obtaining 30.8 g of 4,6-di(1-adamantyl)-1,3-bis(4-nitro-phenoxy)benzene (49.6 mmol; the yield was 85.4%).

Next, in a 300 mL recovery flask, 29.1 g of the obtained 4,6-di(1-adamantyl)-1,3-bis(4-nitro-phenoxy)benzene (46.8 mmol), 1.49 g of 10% palladium-activated carbon (1.40 mmol), 273 mL of N,N-dimethylformamide and a stirrer were charged and agitated at 25° C. for 24 hours under a hydrogen atmosphere. A reaction solution was filtered and then added to 1 L of ion-exchange water. Solid precipitate was collected by filtration, then agitated in 1 L of ion-exchange water for another one hour and dried under reduced pressure, thus obtaining 22.3 g of 4,6-di(1-adamantyl)-1,3-bis(4-amino-phenoxy)benzene (39.7 mmol; the yield was 84.9%).

Appearance and results of mass spectrometry analysis and elemental analysis are shown below. The data show that the obtained compound is a target product.
Appearance: a blown solid
MS (FD) (m/z): 561 (M$^+$)
Elemental analysis:
theoretical figures (/%): C, 81.39; H, 7.91; N, 5.00; O, 5.71.
actual measurement values (/%): C, 81.35; H, 7.88; N: 5.03; O, 5.74.

Synthesis Example 24

Synthesis of 2,7-di(1-adamantyl)-fluorene-9,9-bis(4-aniline)

In a 500 mL four-neck flask provided with a thermometer, a Dimroth condenser and an agitator, 44.9 g of 2,7-diadamantylfluorenone (100 mmol) obtained in Synthesis example 5, 27.9 g of aniline (300 mmol) and 203 mL of Eaton's reagent (7.7 wt % methanesulfonic acid solution of diphosphorus pentoxide) were charged and heated at 150° C. for 12 hours under a nitrogen atmosphere. After a reaction solution reached room temperature, 100 mL of ion-exchange water was added slowly. The reaction solution was charged in a separating funnel and sodium hydroxide was added thereto so as to be pH 7. Then it was subject to three times of extraction with 100 mL of ethyl acetate and dried with magnesium sulfate. Ethyl acetate was removed therefrom by means of an evaporator and a crude product obtained was purified by column chromatography (hexane:ethyl acetate=4:1), thus obtained 51.2 g of 2,7-di(1-adamantyl)fluorene-9,9-bis(4-aniline) (83 mmol; the yield was 83%).

Appearance and results of mass spectrometry analysis and elemental analysis are shown below. The data show that the obtained compound is a target product.

Appearance: a blown solid
MS (FD) (m/z): 617 (M+)
Elemental analysis:
theoretical figures (/%): C, 87.62; H, 7.84; N, 4.54.
actual measurement values (/%): C, 87.64; H, 7.87; N: 4.49.

Synthesis Example 25

Synthesis of 9,9-bis(3,4-dicarboxyphenyl)-2,7-diadamantyl-fluorene-dianhydride

In a 500 mL four-neck flask provided with a thermometer, a Dimroth condenser and an agitator, 66.4 g of 2,7-diadamantylfluorenone (0.148 mol) obtained in Synthesis example 5, 47.1 g of o-xylene (0.444 mol (three times moles)) and 203 mL of Eaton's reagent (7.7 wt % methanesulfonic acid solution of diphosphorus pentoxide) were charged and heated at 150° C. for 12 hours under a nitrogen atmosphere. After a reaction solution reached room temperature, 30 mL of ion-exchange water was added slowly. The reaction solution was charged in a separating funnel, then subject to three times of extraction with 20 mL of ethyl acetate and dried with magnesium sulfate. Ethyl acetate was removed therefrom by means of an evaporator and a crude product obtained was purified by column chromatography (hexane:ethyl acetate=4:1), thus obtaining 77.2 g of 9,9-bis(3,4-dimethyl-phenyl)-2,7-diadamantyl-fluorene (0.12 mol; the yield was 80.9%).

Next, in a 3 L four-neck separable flask provided with a thermometer, an agitator and a reflux tube, the 9,9-bis(3,4-dimethyl-phenyl)-2,7-diadamantyl-fluorene 77.2 g (0.12 mol), 89.0 g of potassium permanganate (0.563 mol), 1 L of pyridine and 100 mL of water were charged, then heated and refluxed at 100° C.

After the beginning of reflux, 38.7 g of potassium permanganate (0.245 mol) and 160 mL of water were added every 30 minutes, a total of four times. When five hours passed after the beginning of reflux, another 160 mL of water was added therein, then heated and refluxed for another six hours. Precipitate was subject to hot filtration. Filtrate thus obtained was condensed and 400 mL of 6 mol/L hydrochloric acid was added therein to generate precipitate. The precipitate was obtained by filtration and then dried, thus obtaining 36.6 g of 9,9-bis(3,4-dicarboxy-phenyl)-2,7-diadamantyl-fluorene (0.048 mol; the yield was 40%).

Next, in a 500 mL four-neck separable flask provided with a thermometer, an agitator and a reflux tube, 35.1 g of the obtained 9,9-bis(3,4-dicarboxy-phenyl)-2,7-diadamantyl-fluorene (0.046 mol) and 34.5 g of acetic anhydride (0.276 mol) were charged. The mixture was refluxed slowly until the 9,9-bis(3,4-dicarboxy-phenyl)-2,7-diadamantyl-fluorene was absolutely dissolved and heated then for another 10 minutes. A reaction mixture thus obtained was placed on a porcelain dish and cooled to be solidified. Pulverization and filtration were performed thereon, and a crystalline lump thus obtained was pulverized in 75 mL of alcohol free ether and filtered. After drying in the air for a short time, it was further dried at 105° C. to reach a certain weight, thus obtaining 29.7 g of 9,9-bis(3,4-dicarboxy-phenyl)-2,7-diadamantyl-fluorene dianhydride (0.0409 mol; the yield was 89.0%).

Appearance and results of mass spectrometry analysis and elemental analysis are shown below. The data show that the obtained compound is a target product.

Appearance: a light yellow solid
MS (FD) (m/z): 727 (M+)
Elemental analysis:
theoretical figures (/%): C, 80.97; H, 5.82; O, 13.21.
actual measurement values (/%): C, 80.95; H, 5.88; O: 13.17.

Synthesis Example 26

Synthesis of 1,3-bis(3,4-dicarboxyphenoxy)-4,6-bis[(3-(1-adamantyl)-(1-adamantyl))-benzene-dianhydride In a 500 mL four-neck flask provided with a thermometer, a Dimroth condenser and an agitator, 35.9 g of 4,6-di[3-(1-adamantyl)-(1-adamantyl)]-1,3-dihydroxybenzene (55.5 mmol) obtained in Synthesis example 15, 19.0 g of dimethyl 4-fluorophthalate (114.5 mmol) and 150 mL of N,N-dimethylformamide were charged. 19.1 g of potassium carbonate (138.1 mmol) was further added. After agitating at 135° C. for 12 hours, a reaction solution was filtered and filtrate was added dropwise to 1 L of ion-exchange water. A precipitated solid was subject to two times of washing with 1 L of methanol followed by drying under reduced pressure at 50° C. for two days, thus obtaining 51.8 g of 1,3-bis(3,4-dicarboxydimethyl-phenoxy)-4,6-bis[(3-(1-adamantyl)-(1-adamantyl)]-benzene (50.2 mmol, the yield was 90.5%).

In a 2 L four-neck flask provided with a thermometer, a Dimroth condenser and an agitator, 500 mL of n-butanol and 33.0 g of potassium hydroxide (85%) (0.5 mol) were charged. The mixture was then heated and refluxed to be dissolved. After addition of 51.6 g of 1,3-bis(3,4-dicarboxydimethyl-phenoxy)-4,6-bis[(3-(1-adamantyl)-(1-adamantyl))-benzene (50 mmol) which was obtained by repeating the above process, the mixture was heated and refluxed for 30 minutes. Next, it was cooled in an ice bath and filtered to obtain crystal thus separated. The crystal was dissolved in 100 mL of ion-exchange water and 5 mol/L hydrochloric acid was added thereto so as to be pH 1 with agitating. A precipitated solid was obtained by filtration. It was subject to two times of washing with ion-exchange water and filtration and also to two times of washing with ethanol. A solid obtained was dried under pressure at 50° C., thus obtaining 45.5 g of 1,3-bis(3,4-dicarboxy-phenoxy)-4,6-bis[(3-(1-adamantyl)-(1-adamantyl)]-benzene (46.7 mmol; the yield was 93.3%).

Next, in a 500 mL four-neck separable flask provided with a thermometer, an agitator and a reflux tube, 44.9 g of 1,3-bis(3,4-dicarboxy-phenoxy)-4,6-bis[(3-(1-adamantyl)-(1-adamantyl))-benzene (0.046 mol) obtained above and 34.5 g of acetic anhydride (0.276 mol) were charged. The mixture was refluxed slowly until 1,3-bis(3,4-dicarboxy-phenoxy)-4,6-bis[(3-(1-adamantyl)-(1-adamantyl))-benzene was absolutely dissolved and heated then for another 10 minutes. A reaction mixture thus obtained was placed on a porcelain dish and cooled to be solidified. Pulverization and filtration were performed thereon, and a crystalline lump thus obtained was pulverized in 75 mL of alcohol free ether and filtered. After drying in the air for a short time, it was further dried at 105° C. to reach a certain weight, thus obtaining 37.8 g of 1,3-bis (3,4-dicarboxy-phenoxy)-4,6-bis[(3-(1-adamantyl)-(1-adamantyl)]-benzene dianhydride (0.0409 mol; the yield was 87.4%).

Appearance and results of mass spectrometry analysis and elemental analysis are shown below. The data show that the obtained compound is a target product.

Appearance: a light yellow solid
MS (FD) (m/z): 938 (M⁺)
Elemental analysis:
theoretical figures (/%): C, 79.29; H, 7.08; O, 13.63.
actual measurement values (/%): C, 79.32; H, 7.05; O: 13.63.

Example 1

Production of Benzoxazole Resin Precursor

In a 2 L four-neck flask provided with a thermometer, a Dimroth condenser and an agitator, 56.3 g of 4,6-di(1-adamantyl)-1,3-bis(4-amino-3-hydroxyphenoxy)benzene (0.095 mol) obtained in Synthesis example 1 was dissolved in 800 g of dried N-methyl-2-pyrrolidone under nitrogen flow followed by the addition of 17.4 g of pyridine (0.22 mol). The mixture was cooled to −15° C. and 65.6 g of 4,6-di(1-adamantyl)-1,3-bis(4-carboxy-phenoxy)benzene dichloride (0.10 mol) obtained in Synthesis example 13 was gradually added. Then, the mixture was agitated at −15° C. for one hour, returned to room temperature and agitated for five hours at room temperature. And then, a reaction solution was added to 4 L of distilled water in small droplets followed by collecting and drying precipitate, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 21,000.

Production of Resin Film

Said benzoxazole resin precursor was dissolved in N-methyl-2-pyrrolidone and filtered with a Teflon (trade name) filter to obtain a varnish for coating. The varnish was applied on a silicon wafer by means of a spin coater (product name: 1H-360S; manufactured by: MIKASA Co., Ltd.) followed by heating in an oven under a nitrogen atmosphere at 90° C. for one minute and at 400° C. for one hour, thus obtaining a resin film.

Example 2

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 81.8 g of 4,6-di(3-(1-adamantyl)-1-adamantyl)-1,3-bis(4-amino-3-hydroxyphenoxy)benzene (0.095 mol) obtained in Synthesis example 3, and also 65.6 g of 4,6-di(1-adamantyl)-1,3-bis(4-carboxy-phenoxy)benzene dichloride (0.10 mol) was altered to 92.4 g 4,6-di[(3-(1-adamantyl)-(1-adamantyl)]-1,3-bis(4-carboxyphenoxy)benzene dichloride (0.10 mol) obtained in Synthesis example 15, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 25,000.

Example 3

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 61.6 g 9,9-bis(3-amino-4-hydroxy-phenyl)-2,7-di(1-adamantyl)-fluorene (0.095 mol) obtained in Synthesis example 5, and also 65.6 g of 4,6-di(1-adamantyl)-1,3-bis(4-carboxy-phenoxy)benzene dichloride (0.10 mol) was altered to 71.2 g of 2,7-diadamantylfluorene-9,9-bisbenzoic acid dichloride (0.10 mol) obtained in Synthesis example 17, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 22,000.

Example 4

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 66.8 g of 9,9-bis(3-amino-4-hydroxy-phenyl)-2,7-di(3,5-dimethyl-1-adamantyl)-fluorene (0.095 mol) obtained in Synthesis example 6, and also 65.6 g of 4,6-di(1-adamantyl)-1,3-bis(4-carboxy-phenoxy)benzene dichloride (0.10 mol) was altered to 76.7 g of 2,7-di(3,5-dimethyl-1-adamantyl)fluorene-9,9-bisbenzoic acid dichloride (0.10 mol) obtained in Synthesis example 18, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 24,500.

Example 5

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 79.1 g of 9,9-bis[4-(3-hydroxy-4-amino-phenoxy)-phenyl]-2,7-di(1-adamantyl)-fluorene (0.095 mol) obtained in Synthesis example 7, and also 65.6 g of 4,6-di(1-adamantyl)-1,3-bis(4-carboxy-phenoxy)benzene dichloride (0.10 mol) was altered to 89.6 g of 9,9-bis[4-(4-carboxy-phenoxy)-phenyl]-2,7-di(1-adamantyl)-fluorene dichloride (0.10 mol) obtained in Synthesis example 19, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 27,000.

Example 6

A reaction was performed in the same condition as in the production of a benzoxazole resin precursor in Example 1 except that 56.3 g of 4,6-di(1-adamantyl)-1,3-bis(4-amino-3- hydroxyphenoxy)benzene (0.095 mol) was altered to 51.3 g of 2,2'-dihydroxy-3,3'-diamino-5,5'-bis(3,5-dimethyl-1-adamantyl)-biphenyl (0.095 mol) obtained in Synthesis example 9, and also 65.6 g of 4,6-di(1-adamantyl)-1,3-bis(4-carboxy-phenoxy)benzene dichloride (0.10 mol) was altered to 95.2 g of 9,9-bis[4-(4-carboxy-phenoxy)-phenyl]-2,7-di(3,5-dimethyl-1-adamantyl)-fluorene dichloride (0.10 mol) obtained in Synthesis example 20, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 24,500.

Example 7

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 46.0 g of 2,2'-dihydroxy-3,3'-diamino-5,5'-bis[(3-(1-adamantyl)-(1-adamantyl))-biphenyl (0.095 mol) obtained in Synthesis example 8, and also 65.6 g of 4,6-di(1-adamantyl)-1,3-bis(4-carboxy-phenoxy)benzene dichloride (0.10 mol) was altered to 100.0 g of 2,2'-bis[(4-carboxy-phenoxy)-phenyl]-5,5'-bis[3-(1-adamantyl)-(1-adamantyl)]-biphenyl dichloride (0.10 mol) obtained in Synthesis example 21, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 26,000.

Example 8

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 89.0 g of 2,2'-bis[4-(3-hydroxy-4-amino-phenoxy)]-5,5'-bis[3-(1-adamantyl)-(1-adamantyl)]-biphenyl (0.095 mol) obtained in Synthesis example 11, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 24,000.

Example 9

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 64 g of 4,6-di(3,5-dimethyl-1-adamantyl)-1,3-bis(4-amino-3-hydroxyphenoxy)benzene (0.095 mol) obtained in Synthesis example 2, and also 65.6 g of 4,6-di(1-adamantyl)-1,3-bis(4-carboxy-phenoxy)benzene dichloride (0.10 mol) was altered to 71 g of 4,6-di(3,5-dimethyl-1-adamantyl)-1,3-bis(4-carboxy-phenoxy)benzene dichloride (0.10 mol) obtained in Synthesis example 14, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 20,000.

Example 10

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 92 g of 4,6-di(3-(3,5-dimethyl-1-adamantyl)-(3,5-dimethyl-1-adamantyl))-1,3-bis(4-amino-3-hydroxyphenoxy)benzene (0.095 mol) obtained in Synthesis example 4, and also 4,6-di[(3-(1-adamantyl)-(1-adamantyl))-1,3-bis(4-carboxy-phenoxy)benzene dichloride was altered to 103 g of 4,6-di[3-(5,7-dimethyl-1-adamantyl)-(3,5-dimethyl-1-adamantyl)]-1,3-bis(4-carboxy-phenoxy)benzene dichloride (0.10 mol) obtained in Synthesis example 16, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 16,000.

Example 11

A reaction was performed in the same condition as in the production of a benzoxazole resin precursor in Example 8 except that 89.0 g of 2,2'-bis[4-(3-hydroxy-4-amino)phenoxy-phenyl]-5,5'-bis[(3-(1-adamantyl)-(1-adamantyl)]biphenyl (0.095 mol) was altered to 82 g of 2,2'-dihydroxy-3,3'-diamino-5,5'-bis(3-(5,7-dimethyl-1-adamantyl)-(3,5-dimethyl-1-adamantyl))biphenyl (0.095 mol) obtained in Synthesis example 10, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 26,000.

Example 12

A reaction was performed in the same condition as in the production of a benzoxazole resin precursor in Example 8 except that 89.0 g of 2,2'-bis[4-(3-hydroxy-4-amino)phenoxy-phenyl]-5,5'-bis[(3-(1-adamantyl)-(1-adamantyl)]biphenyl (0.095 mol) was altered to 68 g of 2,2'-bis[4-(3-hydroxy-4-amino)phenoxy]-5,5'-bis(3-(3,5-dimethyl-1-adamantyl)biphenyl (0.095 mol) obtained in Synthesis example 12, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 15,000.

Example 13

In a 2 L four-neck flask provided with a thermometer, a Dimroth condenser and an agitator, 64.8 g of 4,6-di(3,5-dimethyl-1-adamantyl)-1,3-bis(4-amino-3-hydroxyphenoxy)benzene (0.10 mol) obtained in Synthesis example 2 was dissolved in 800 g of dried N-methyl-2-pyrrolidone under nitrogen flow followed by the addition of 17.4 g of pyridine (0.22 mol). The mixture was heated to 60° C., then 42.8 g of 5,5',7,7'-tetramethyl-1,1'-biadamantane-3,3'-dicarboxylic acid chloride (0.095 mol) was gradually added and then agitated at 60° C. for three hours. Then, 2.10 g of benzoic acid chloride (0.015 mol) was added with the inner temperature of the flask kept at 5° C. or below in an ice bath. A reaction solution was added to 4 L of distilled water in small droplets followed by collecting and drying precipitate, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 15,000.

Example 14

In a 2 L four-neck flask provided with a thermometer, a Dimroth condenser and an agitator, 64.8 g of 4,6-di(3,5-dimethyl-1-adamantyl)-1,3-bis(4-amino-3-hydroxyphenoxy)benzene (0.10 mol) obtained in Synthesis example 2 was dissolved in 800 g of dried N-methyl-2-pyrrolidone under nitrogen flow followed by the addition of 17.4 g of pyridine (0.22 mol). The mixture was heated to 60° C. and 31.6 g of 5,5',7,7'-tetramethyl-1,1'-biadamantane-3,3'-dicarboxylic acid chloride (0.070 mol) was gradually added and then agitated at 60° C. for three hours. 7.57 g of 5-phenyl-ethynyl-isophthalic acid chloride (0.025 mol) was gradually added with the inner temperature of the flask kept at 5° C. or below in an ice bath. Then, 2.10 g of benzoic acid chloride (0.015 mol) was added with the inner temperature of the flask kept at 5° C. or below. A reaction solution was added to 4 L of distilled water in small droplets followed by collecting and drying precipitate, thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 16,000.

Example 15

In a separable flask provided with an agitator, a nitrogen inlet pipe and a material inlet, 53.3 g of 4,6-di(1-adamantyl)-1,3-bis(4-amino-phenoxy)benzene (0.095 mol) was dissolved in 800 g of dried N-methyl-2-pyrrolidone (hereinafter, it is simply referred to as "NMP"). A solution obtained was cooled to 10° C. under nitrogen flow followed by the addition of 72.7 g of 9,9-bis(3,4-dicarboxyphenyl)-2,7-diadamantyl-fluorene-dianhydride (0.1 mol). For five hours after the addition, the solution was returned to room temperature. Then, it was agitated for two hours at room temperature. And then, a reaction solution obtained was added to 4 L of distilled water in small droplets followed by collecting and drying precipitate, thus obtaining a polyimide resin precursor.

Number average molecular weight (Mn) of the obtained polyimide resin precursor, which was measured by means of a gel permeation chromatography (manufactured by: Tosoh Corporation) using polystyrene as the standard, was 24,000.

Example 16

In a separable flask provided with an agitator, a nitrogen inlet pipe and a material inlet, 58.6 g of 2,7-di(1-adamantane)-fluorene-9,9-bis(4-aniline) (0.095 mol) was dissolved in 1 L of dried N-methyl-2-pyrrolidone (hereinafter, it is simply referred to as "NMP"). A solution obtained was cooled to 10° C. under nitrogen flow followed by the addition of 93.9 g of 1,3-bis(3,4-dicarboxyphenoxy)-4,6-bis[(3-(1-adamantyl)-(1-adamantyl))-benzene-dianhydride (0.1 mol). For five hours after the addition, the solution was returned to room temperature. Then, it was agitated for two hours at room temperature. Then, a reaction solution obtained was added to 4 L of distilled water in small droplets followed by collecting and drying precipitate, thus obtaining a polyimide resin precursor.

Number average molecular weight (Mn) of the obtained polyimide resin precursor, which was measured by means of a gel permeation chromatography (manufactured by: Tosoh Corporation) using polystyrene as the standard, was 24,000.

Comparative Example 1

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 20.6 g of 3,3'-dihydroxy-4,4'-diamino-biphenyl (0.095 mol), and also 65.6 g of 4,6-di(1-adamantyl)-1,3-bis(4-carboxy-phenoxy)benzene dichloride (0.10 mol) was altered to 20.3 g of isophthalic acid dichloride (manufactured by: Tokyo Chemical Industry Co., Ltd.), thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 19,000.

Comparative Example 2

A reaction was performed in the same condition as in the production of a benzoxazole resin precursor in Example 1 except that 56.3 g of 4,6-di(1-adamantyl)-1,3-bis(4-amino-3-hydroxyphenoxy)benzene (0.095 mol) was altered to 36.1 g of 9,9-bis(3-amino-4-hydroxy-phenyl)-fluorene (0.095 mol), and also 65.6 g of 4,6-di(1-adamantyl)-1,3-bis(4-carboxy-phenoxy)benzene dichloride (0.10 mol) was altered to 38.7 g of 1,3-bis(4-carboxy-phenoxy)-benzene (0.1 mol), thus obtaining a benzoxazole resin precursor.

Number average molecular weight (Mn) of the obtained benzoxazole resin precursor, which was measured by means of a gel permeation chromatography (manufactured by: Tosoh Corporation) using polystyrene as the standard, was 20,000.

Comparative Example 3

In a separable flask provided with an agitator, a nitrogen inlet pipe and a material inlet, 10.3 g of m-phenylenediamine (0.095 mol) was dissolved in 300 g of dried N-methyl-2-pyrrolidone (hereinafter, it is simply referred to as "NMP"). A solution obtained was cooled to 10° C. under nitrogen flow followed by the addition of 29.4 g of biphenyltetracarboxylic acid dianhydride (0.1 mol). For five hours after the addition, the solution was returned to room temperature. Then, it was agitated for two hours at room temperature. Then, a reaction solution obtained was added to 4 L of distilled water in small droplets followed by collecting and drying precipitate, thus obtaining a polyimide resin precursor.

Number average molecular weight (Mn) of the obtained polyimide resin precursor, which was measured by means of a gel permeation chromatography (manufactured by: Tosoh Corporation) using polystyrene as the standard, was 20,000.

Comparative Example 4

In a separable flask provided with an agitator, a nitrogen inlet pipe and a material inlet, 33.1 g of fluorene-9,9-bis(4-aniline) (0.095 mol) was dissolved in 300 g of dried N-methyl-2-pyrrolidone (hereinafter, it is simply referred to as "NMP"). A solution obtained was cooled to 10° C. under nitrogen flow followed by the addition of 40.2 g of 2,4-bis[(3,4-dicarboxy)-phenoxy]-benzene dianhydride (0.1 mol). For five hours after the addition, the solution was returned to room temperature. Then, it was agitated for two hours at room temperature. Then, a reaction solution obtained was added to 4 L of distilled water in small droplets followed by collecting and drying precipitate, thus obtaining a polyimide resin precursor.

Number average molecular weight (Mn) of the obtained polyimide resin precursor, which was measured by means of a gel permeation chromatography (manufactured by: Tosoh Corporation) using polystyrene as the standard, was 23,000.

Evaluation of resin films obtained in Examples 1 to 16 and Comparative examples 1 to 4 was conducted. Evaluation items and methods are as follows. The results obtained are shown in Table 1.

1. Solubility 1 g of polybenzoxazole resin precursor or polyimide resin precursor and 3 g of N-methyl-2-pyrrolidone were charged in a glass sample container with a lid and agitated with a stirrer for one hour. Solubility was then determined by the presence of insoluble matter observed in the container.

2. Heat Resistance

Heat resistance was evaluated by the glass transition temperature and thermal decomposition temperature. The glass transition temperature is a peak top temperature of tan δ obtained by measuring each of the resin films by means of a dynamic viscoelasticity measurement device (manufactured by: Seiko Instruments Inc.) under a nitrogen flow of 300 mL/min and at a heating rate of 3° C./min and a frequency of 1 Hz.

Thermal decomposition temperatures of the resin films were measured by means of a TG/DTA measurement device (product name: TG/DTA220; manufactured by: Seiko Instruments Inc.) under a nitrogen flow of 200 mL/min and at a heating rate of 10° C./min. Those are temperatures measured when the resin films each exhibited a 5% reduction in weight.

3. Relative Dielectric Constant

With reference to JIS-K6911, a measurement of the capacity of an adhesive film for semiconductor was carried out at a frequency of 100 kHz and by means of a Precision LCR Meter (product name: HP-4284A; manufactured by: Hewlett-Packard Development Company, L.P.). Then, relative dielectric constant was calculated by the following formula.

Relative dielectric constant=(measured capacity×film thickness)/(vacuum dielectric constant×measured area)

TABLE 1

|  | Example 1 | Example 2 | Example 3 | Example 4 | Example 5 |
| --- | --- | --- | --- | --- | --- |
| Solubility | Soluble | Soluble | Soluble | Soluble | Soluble |
| Glass Transition temperature(° C.) | 411 | 407 | 419 | 410 | 408 |
| Thermal Decomposition temperature | 489 | 482 | 520 | 490 | 488 |
| Dielectric constant | 2.5 | 2.2 | 2.4 | 2.3 | 2.5 |

|  | Example 6 | Example 7 | Example 8 | Example 9 | Example 10 |
| --- | --- | --- | --- | --- | --- |
| Solubility | Soluble | Soluble | Soluble | Soluble | Soluble |
| Glass Transition temperature(° C.) | 400 | 415 | 402 | 404 | 400 |
| Thermal Decomposition temperature | 485 | 510 | 495 | 505 | 490 |
| Dielectric constant | 2.3 | 2.2 | 2.4 | 2.3 | 2.2 |

|  | Example 11 | Example 12 | Example 13 | Example 14 | Example 15 |
| --- | --- | --- | --- | --- | --- |
| Solubility | Soluble | Soluble | Soluble | Soluble | Soluble |
| Glass Transition temperature(° C.) | 405 | 401 | 404 | 410 | 404 |
| Thermal Decomposition temperature | 490 | 510 | 500 | 505 | 505 |
| Dielectric constant | 2.3 | 2.2 | 2.3 | 2.4 | 2.5 |

TABLE 1-continued

|  | Example 16 | Comparative example 1 | Comparative example 2 | Comparative example 3 | Comparative example 4 |
| --- | --- | --- | --- | --- | --- |
| Solubility | Soluble | Insoluble | Soluble | Hardly-soluble | Soluble |
| Glass Transition temperature(° C.) | 405 | — | 350 | 320 | 355 |
| Thermal Decomposition temperature | 507 | — | 488 | 502 | 484 |
| Dielectric constant | 2.3 | — | 3.0 | 3.3 | 3.0 |

As is clear from Table 1, in Examples 1 to 16, the glass transition temperature and the thermal decomposition temperature were high and the heat resistance was excellent.

It is also shown that Examples 1 to 16 have solubility in a solvent, low dielectric constant, excellent workability and excellent dielectric properties.

In Comparative example 1, a resin film was not prepared due to poor solubility and it was not able to measure the glass transition temperature, the thermal decomposition temperature and the dielectric constant.

In Comparative examples 2 to 4, the thermal decomposition temperature was excellent; however, the glass transition temperature was low and the dielectric constant was high.

Next, an interlayer insulation film and a semiconductor device will be described.

Example 17

Production of Varnish and Semiconductor Device for Coating

A benzoxazole resin precursor obtained in Example 2 is dissolved in N-methyl-2-pyrrolidone and filtered with a Teflon (trade name) filter to obtain a varnish for coating.

A silicon nitride layer is formed on a semiconductor substrate by known methods and the varnish for coating is applied on the silicon nitride layer by means of a spin coater (product name: 1H-360S; manufactured by: MIKASA Co., Ltd.) followed by heating in an oven under a nitrogen atmosphere at 90° C. for one minute and 400° C. for one hour to form an interlayer insulation film with a thickness of 0.3 μm.

Next, a metal wiring is formed in the interlayer insulation film in an optional pattern, thus obtaining a semiconductor device.

Example 18

Production of Varnish and Semiconductor Device for Coating

A benzoxazole resin precursor obtained in Example 3 is dissolved in N-methyl-2-pyrrolidone and filtered with a Teflon (trade name) filter to obtain a varnish for coating.

A silicon nitride layer is formed on a semiconductor substrate by known methods and the varnish for coating is applied on the silicon nitride layer by means of a spin coater (product name: 1H-360S; manufactured by: MIKASA Co., Ltd.) followed by heating in an oven under a nitrogen atmosphere at 90° C. for one minute and 400° C. for one hour to form an interlayer insulation film with a thickness of 0.3 μm.

Next, a metal wiring is formed in the interlayer insulation film in an optional pattern, thus obtaining a semiconductor device.

Example 19

Production of Varnish and Semiconductor Device for Coating

A polyimide resin precursor obtained in Example 13 is dissolved in N-methyl-2-pyrrolidone and filtered with a Teflon (trade name) filter to obtain a varnish for coating.

A silicon nitride layer is formed on a semiconductor substrate by known methods and the varnish for coating is applied on the silicon nitride layer by means of a spin coater (product name: 1H-360S; manufactured by: MIKASA Co., Ltd.) followed by heating in an oven under a nitrogen atmosphere at 90° C. for one minute and 350° C. for one hour to form an interlayer insulation film with a thickness of 0.3 μm.

Next, a metal wiring is formed in the interlayer insulation film in an optional pattern, thus obtaining a semiconductor device.

Rates of wiring delay of the obtained semiconductor devices were evaluated.

Semiconductor devices made by using interlayer insulation films of Examples 17, 18 and 19 were each compared with a semiconductor device having the same structure as said semiconductor devices and a $SiO_2$ insulation film in terms of the degree of wiring delay. A signal delay time determined by converting an oscillation frequency of a ring oscillator was used as an evaluation criterion.

As a result of comparing those, it was confirmed that the semiconductor devices of the present invention had less wiring delay, and in terms of the rate of wiring delay, there was a rise of about 20% in Example 17, about 15% in Example 18 and about 10% in Example 19.

INDUSTRIAL APPLICABILITY

A resin composition, a polyimide resin composition, a polybenzoxazole resin composition, a varnish, a resin film and a semiconductor device using the same can be used as a organic material (especially as a resin precursor) constituting an interlayer insulation film with excellent heat resistance and electrical properties, and low dielectric constant or as a semiconductor device comprising an interlayer insulation film with excellent heat resistance and electrical properties, and low dielectric constant.

What is claimed is:

1. A resin composition comprising a compound having a structure represented by a general formula (1):

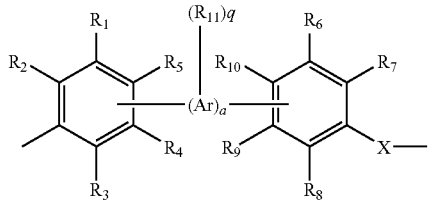

(1)

wherein, Ar is an aromatic group; "a" is 1; $R_{11}$ is hydrogen or an organic group having one or more carbon atoms; when "q" is an integer of 2 or more, $R_{11}$s may be the same or different from each other; at least one of $R_1$ to $R_5$ and at least one of $R_6$ to $R_{10}$ on respective benzene rings are Ar-binding sites and the others of $R_1$ to $R_5$ and $R_6$ to $R_{10}$ are each hydrogen, a group having an alicyclic structure, an organic group having 1 to 10 carbon atoms other than the group having an alicyclic structure, a hydroxyl group or a carboxyl group; at least one of $R_{11}$, $R_1$ to $R_5$ and $R_6$ to $R_{10}$ is a group having an alicyclic structure; "q" is an integer of 1 or more; and X is any of —O—, —NHCO—, —COHN—, —COO— and —OCO—; and wherein the compound comprises at least one group having an adamantane structure as $R_{11}$.

2. A resin composition according to claim 1, wherein the compound having a structure represented by the general formula (1) comprises at least one group having an alicyclic structure as $R_{11}$.

3. A resin composition according to claim 2, wherein the compound having a structure represented by the general formula (1) has Ar-binding sites as at least one of $R_1$ to $R_5$ and at least one of $R_6$ to $R_{10}$ on respective benzene rings, and the others of $R_1$ to $R_5$ and $R_6$ to $R_{10}$ are each hydrogen, an organic group having 1 to 10 carbon atoms other than the group having an alicyclic structure, a hydroxyl group or a carboxyl group.

4. A resin composition according to any of claims 1 to 3, wherein the compound having a structure represented by the general formula (1) comprises a group selected from structures represented by general formula (2) as "Ar" of the general formula (1):

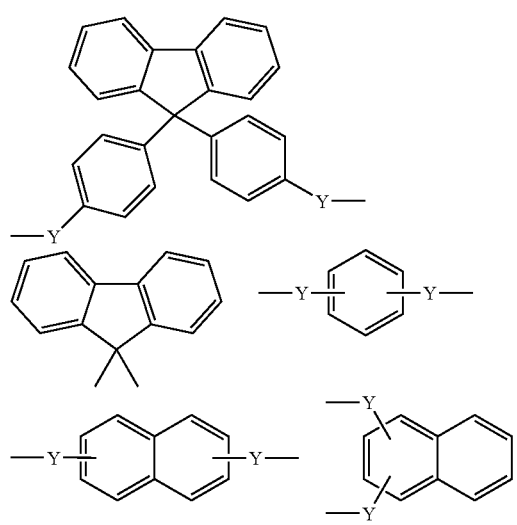

(2)

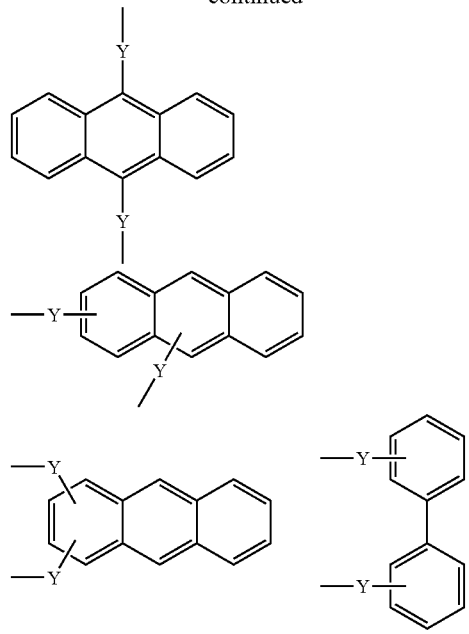

wherein, Y is any of —O—, —S—, —OCO— and COO—.

5. A resin composition according to claim 1, wherein the group having an alicyclic structure is a group having an adamantane structure.

6. A resin composition according to claim 5, wherein the group having an alicyclic structure is a group having an adamantane structure substituted with an alkyl group having 1 to 20 carbon atoms.

7. A resin composition according to claim 1, wherein the compound having a structure represented by the general formula (1) or (1') comprises —NHCO— as X of the general formula (1) or (1') and carboxyl groups as $R_2$ or $R_3$, and $R_7$ or $R_8$.

8. A resin composition according to claim 1, wherein the compound having a structure represented by the general formula (1) or (1') comprises —CONH— as X of the general formula (1) or (1') and hydroxyl groups as $R_2$ or $R_3$, and $R_7$ or $R_8$.

9. A resin composition obtained by dehydrating and ring-closing the compound having a structure represented by the general formula (1) or (1') of the resin composition of claim 1.

10. A polyimide resin composition obtained by dehydrating and ring-closing the compound having a structure represented by the general formula (1) or (1') of the resin composition of claim 8.

11. A polybenzoxazole resin composition obtained by dehydrating and ring-closing the compound having a structure represented by the general formula (1) or (1') of the resin composition of claim 8.

12. A varnish obtained from the resin composition of claim 1.

13. A resin film obtained by heat-treating the resin composition of claim 1.

14. A semiconductor device comprising the resin film of claim 13.

* * * * *